United States Patent
Shin

(10) Patent No.: US 10,854,292 B2
(45) Date of Patent: Dec. 1, 2020

(54) SENSING CIRCUITS AND METHODS OF OPERATING NONVOLATILE MEMORY DEVICES BASED ON OPERATING TEMPERATURES

(71) Applicant: Samsung Electronics Co., Ltd., Suwon-si (KR)

(72) Inventor: Hyun-Jin Shin, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/367,115

(22) Filed: Mar. 27, 2019

(65) Prior Publication Data
US 2020/0111529 A1  Apr. 9, 2020

(30) Foreign Application Priority Data

Oct. 4, 2018 (KR) ........................ 10-2018-0118358

(51) Int. Cl.
| | | |
|---|---|---|
| *G11C 16/04* | (2006.01) | |
| *G11C 7/12* | (2006.01) | |
| *G11C 16/28* | (2006.01) | |
| *G05F 3/26* | (2006.01) | |

(52) U.S. Cl.
CPC ............ *G11C 16/045* (2013.01); *G05F 3/262* (2013.01); *G11C 7/12* (2013.01); *G11C 16/28* (2013.01)

(58) Field of Classification Search
CPC ......... G11C 16/045; G11C 16/28; G11C 7/12; G05F 3/262
See application file for complete search history.

(56) References Cited

U.S. PATENT DOCUMENTS

| | | |
|---|---|---|
| 7,495,961 B2 | 2/2009 | Cho et al. |
| 8,320,171 B2 | 11/2012 | Park |
| 8,760,933 B2 | 6/2014 | Yamada |
| 8,760,951 B2 | 6/2014 | Park |
| 9,478,261 B1 | 10/2016 | Lim et al. |
| 9,508,446 B1 | 11/2016 | Chen et al. |
| 9,905,301 B2 | 2/2018 | Yoo et al. |
| 2005/0063084 A1* | 3/2005 | Fujiwara ................ G11B 5/022 360/46 |
| 2005/0213387 A1* | 9/2005 | Kubo ..................... G11C 5/145 365/185.21 |

(Continued)

FOREIGN PATENT DOCUMENTS

KR   10-2012-0013539 A   2/2012

*Primary Examiner* — Sultana Begum
(74) *Attorney, Agent, or Firm* — Muir Patent Law, PLLC

(57) ABSTRACT

A sensing circuit of nonvolatile memory device includes a precharge current generator, an adjusting transistor, and an adaptive control voltage generator. The precharge current generator connected to a sensing node and generates a precharge current provided to a bit-line of the nonvolatile memory device, in response to a precharge signal. The adjusting transistor, connected between the sensing node and a first node, adjusts an amount of the precharge current provided to the bit-line in response to a first control voltage. The adaptive control voltage generator generates a control current proportional to an operating temperature, in response to the precharge signal and a second control voltage and boosts a level of the first control voltage in proportion to the operating temperature. The second control voltage is inversely proportional to the operating temperature.

20 Claims, 19 Drawing Sheets

(56) References Cited

U.S. PATENT DOCUMENTS

| | | | |
|---|---|---|---|
| 2006/0133162 A1* | 6/2006 | Wang | G11C 16/12 |
| | | | 365/189.11 |
| 2010/0091551 A1* | 4/2010 | Hosono | G11C 13/0004 |
| | | | 365/148 |
| 2015/0138870 A1* | 5/2015 | Joo | G11C 7/04 |
| | | | 365/104 |

* cited by examiner

SENSING CIRCUITS AND METHODS OF OPERATING NONVOLATILE MEMORY DEVICES BASED ON OPERATING TEMPERATURES

CROSS-REFERENCE TO RELATED APPLICATION

This U.S. non-provisional patent application claims priority under 35 U.S.C. § 119 to Korean Patent Application No. 10-2018-0118358, filed on Oct. 4, 2018, in the Korean Intellectual Property Office (KIPO), the disclosure of which is incorporated in its entirety by reference herein.

BACKGROUND

1. Technical Field

Example embodiments relate generally to semiconductor memory devices, and more particularly to sensing circuits of nonvolatile memory devices, nonvolatile memory devices including the same and methods of operating the nonvolatile memory devices.

2. Discussion of the Related Art

Semiconductor memory devices may be classified into a volatile memory and a nonvolatile memory depending on data retention characteristics of the memory devices upon being cut off from power supply. NAND flash memory devices are typically nonvolatile memory devices, and include a plurality of NAND flash memory cells.

NAND flash memory cells may be divided into on-cells and off-cells depending on a program. When one of the memory cells is an on-cell, a current flowing in a bit line is referred to as an on-cell current, and when one of the memory cell is an off-cell, a current flowing in the bit line is referred to as an off-cell current.

As a process is refined, an operation voltage may be lowered, and thereby the on-cell currents may be reduced, and leakage currents of a bit line may increase at a high temperature (for example, 85.degree. C. to 150.degree. C.). When the off-cell is read, the off-cell may be sensed as the on-cell by mistake due to the leakage currents flowing through the bit line, thereby reducing a sense margin of the on-cell and the off-cell.

SUMMARY

Some example embodiments are directed to a sensing circuit of a nonvolatile memory device, capable of enhancing performance and reliability.

Some example embodiments are directed to a nonvolatile memory device capable of enhancing performance and reliability.

Some example embodiments are directed to a method of operating a nonvolatile memory device, capable of enhancing performance and reliability.

According to example embodiments, a sensing circuit of nonvolatile memory device includes a precharge current generator, an adjusting transistor, an adaptive control voltage generator and a current adjusting circuit. The precharge current generator is connected to a sensing node, and generates a precharge current provided to a bit-line of the nonvolatile memory device, in response to a precharge signal. The adjusting transistor is connected between the sensing node and a first node coupled to the bit-line, and adjusts an amount of the precharge current provided to the bit-line in response to a first control voltage. The adaptive control voltage generator generates a control current which is proportional to an operating temperature of the nonvolatile memory device, in response to the precharge signal and a second control voltage and boosts a level of the first control voltage in proportion to the operating temperature, based on the control current. The second control voltage is inversely proportional to the operating temperature.

According to example embodiments, a nonvolatile memory device includes a memory cell array, a column selection circuit, a sensing circuit connected to the column selection circuit, and a control circuit. The memory cell array includes a plurality of memory cells coupled to a plurality of word-lines and a plurality of bit-lines. A column selection circuit includes a plurality of selection transistors coupled to the bit-lines, respectively. The control circuit controls the column selection circuit, the sensing circuit based on a command and an address. The sensing circuit includes a precharge current generator, an adjusting transistor, and an adaptive control voltage generator. The precharge current generator is connected to a sensing node and generates a precharge current provided to a first bit-line of the plurality of bit-lines, in response to a precharge signal. The adjusting transistor is connected between the sensing node and a first node coupled to the first bit-line, and adjusts an amount of the precharge current provided to the first bit-line in response to a first control voltage. The adaptive control voltage generator generates a control current which is proportional to an operating temperature of the nonvolatile memory device, in response to the precharge signal and a second control voltage and boosts a level of the first control voltage in proportion to the operating temperature, based on the control current. The second control voltage is inversely proportional to the operating temperature.

According to example embodiments, a method of operating a nonvolatile memory device is provided. The nonvolatile memory device includes a memory cell array including a plurality of memory cells coupled to a plurality of word-lines and a plurality of bit-lines, a column selection circuit including a plurality of selection transistors coupled to the bit-lines, respectively, and a sensing circuit connected to the column selection circuit. According to the method, a precharge current is provided to a sensing node by the sensing circuit, the precharge current provided to a selected bit-line among the bit-lines according to an operating temperature of the nonvolatile memory device is adjusted by applying a first control voltage to a gate of an adjusting transistor that connects the sensing node to a first group of selection transistors among the selection transistors. A level of the first control voltage increases in proportional to the operating temperature. A boost voltage greater than a power supply voltage is applied to a first selection transistor and a first word-line, the first selection transistor of the first group of selection transistors is coupled to the selected bit-line and the first word-line is coupled to a selected memory cell. A voltage of the sensing node is sensed to be outputted as data.

Accordingly, a sensing circuit may compensate for a leakage current of the bit-line by adaptively adjusting the amount of the precharge current provided to the bit-line depending on change of the temperature, and thus precharges the bit-line sufficiently at a high temperature and prevent over-precharge of the bit-lien at a low temperature.

BRIEF DESCRIPTION OF THE DRAWINGS

Illustrative, non-limiting example embodiments will be more clearly understood from the following detailed description in conjunction with the accompanying drawings.

DETAILED DESCRIPTION

Various example embodiments will be described more fully hereinafter with reference to the accompanying drawings, in which some example embodiments are shown.

Figure 1:
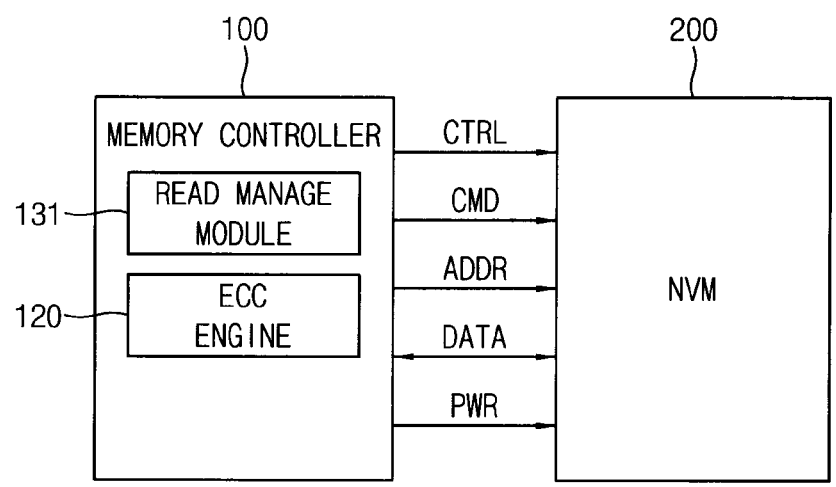
FIG. 1 is a block diagram illustrating a storage device the according to example embodiments.

FIG. 1 is a block diagram illustrating a storage device the according to example embodiments.

Referring to FIG. 1, a storage device (e.g., a memory system) 10 may include a memory controller 100 and at least one nonvolatile memory device 200.

In example embodiments, each of the memory controller 100 and the nonvolatile memory device 200 may be provided with the form of a chip, a package, or a module. Alternatively, the memory controller 100 and the nonvolatile memory device 200 may be packaged into one of various packages.

The nonvolatile memory device 200 may perform an erase operation, a program operation or a write operation under control of the memory controller 100. The nonvolatile memory device 200 receives a command CMD, an address ADDR and data DATA through input/output lines from the memory controller 100 for performing such operations. In addition, the nonvolatile memory device 200 receives a control signal CTRL through a control line from the memory controller 100. In addition, the nonvolatile memory device 200 receives a power PWR through a power line from the memory controller 100.

The nonvolatile memory device 200 may include a memory cell array. The memory cell array may include a plurality of memory blocks. Each of the plurality of memory blocks may include a plurality of pages. Each of the plurality of pages may include a plurality of memory cells. The plurality of memory cells may be connected to a plurality of word-lines and bit-lines. The plurality of memory cells of the nonvolatile memory device 200 have different threshold voltages depending on the data states and the physical characteristics of the memory cells as the threshold voltages of the memory cells may be affected by a program elapsed time, a temperature (e.g., operating temperature), program disturbance, or read disturbance. Due to the reasons described above, data stored in the nonvolatile memory device 200 may become deteriorated and result in read data error. For correcting such data errors, the memory controller 100 may utilize a variety of error correction techniques. For example, the memory controller 100 may include an error correction code (ECC) engine 120 and a read manage module 131.

During a read operation, the memory controller 100 may read data stored in a first page of the nonvolatile memory device 200, using a default read voltage set. The default read voltage set may include predetermined read voltages. The ECC engine 120 may detect and correct errors included in data read from the nonvolatile memory device 200. In example embodiments, the ECC engine 120 may be implemented in the form of hardware.

Data read in a read operation may include error bits more than the ECC engine 120 may correct. In this case, the ECC engine 120 fails to correct the errors of the data, which may be referred to as an 'uncorrectable error correction code (UECC) error'. Data having the UECC error may be referred to as an 'UECC data'.

When the UECC error occurs, the read manage module 131 may adjust a read voltage set of the nonvolatile memory device 200. The memory controller 100 may repeat to send the same address ADDR, command CMD, and control signal CTRL with previously sent to the nonvolatile memory device 200 to perform a read operation with adjusted read voltage set. The adjusted read voltage set may be included in the control signal CTRL or the command CMD. The ECC engine 120 may repeat to detect and correct an error of read data that is read with the adjusted read voltage set until the UECC error being corrected.

In example embodiments, the read manage module 131 may repeat to adjust a read voltage set for the predetermined number of times, and the ECC engine 120 may repeat to detect and correct an error of data that is read using the adjusted read voltage set. For example, the memory controller 100 may repeat a set of operations the predetermined number of times, adjusting a read voltage set, reading data using the adjusted read voltage set, and correcting an error of the read data.

When an error of read data is corrected during iteration of the set of operations, the memory controller 100 may output corrected data to a host and stop iteration of the set of operations. When a read operation is iterated under a control of the read manage module 131, for example, read data or particular page data of the read data may be stored in a buffer 130 shown in FIG. 2. The buffer 130 may be a static random access memory (SRAM).

When an error of read data is not corrected after iteration of the set of operations (i.e., when the UECC error occurs), the memory controller 100 may determine a starting voltage set for performing valley search operation based on the data stored in the buffer 130.

When a read operation is performed on the first page in the memory cell array, the nonvolatile memory device 200 searches a valley by performing a first read operation including two sequential sensing operation and performs a second read operation based on the searched valley. Therefore, the nonvolatile memory device 200 may adjust a level of the read voltage according to a change of threshold voltage distributions without intervention of the memory controller 100.

The nonvolatile memory device 200, when a read operation on a first page selected from a memory cell array is performed, adjusts a precharge current according to a temperature and provides the adjusted precharge current to a bit-line. Therefore, the nonvolatile memory device 200 precharges the bit-line sufficiently with reducing leakage current at a high temperature (e.g., greater than a reference temperature) and increase read speed by preventing the bit-line from being overcharged at a low temperature (e.g., smaller than the reference temperature). In addition, the nonvolatile memory device 200 may ensure current margin of on-cell by boosting a voltage level of a selected word-line coupled to the on-cell. For example, the nonvolatile memory device 200 may boost the voltage level of the selected word-line in a read operation.

Figure 2:
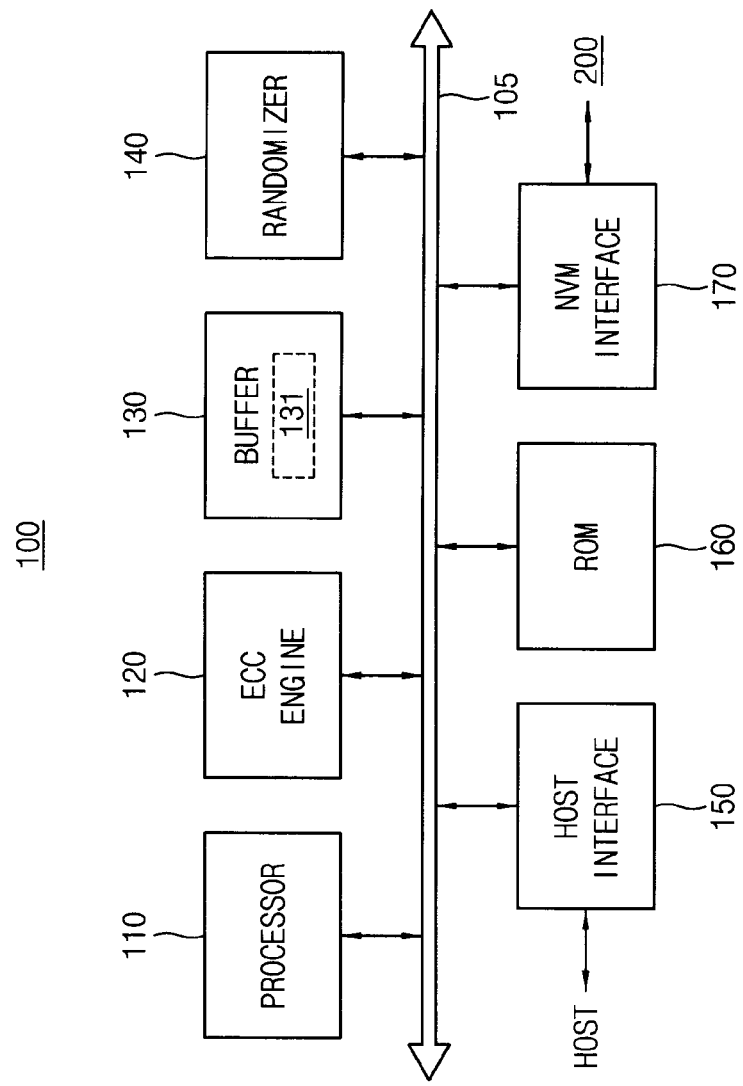
FIG. 2 is a block diagram illustrating the memory controller in the storage device of FIG. 1 according to example embodiments.

FIG. 2 is a block diagram illustrating the memory controller in the storage device of FIG. 1 according to example embodiments.

Referring to FIGS. 1 and 2, the memory controller 100 may include a processor 110, an ECC engine 120, a buffer 130, a read manage module 131, a randomizer 140, a host interface 150, a read only memory (ROM) 160 and a nonvolatile memory interface 170 which are connected via a bus 105. The ECC engine 120, the buffer 130 and the read manage module 131 performs substantially same function described above relating with FIG. 1.

The processor 110 controls an overall operation of the memory controller 100. In example embodiments, the read manage module 131 may be implemented in software and stored in the buffer 130. The read manage module 131 stored in the buffer 130 may be driven by the processor 110. The ROM 160 stores a variety of information, needed for the memory controller 100 to operate, in firmware.

The randomizer 140 randomizes data to be stored in the nonvolatile memory device 200. For example, the randomizer 140 randomizes data to be stored in the nonvolatile memory device 200 on a word-line basis.

Data randomizing is to process data to balance ratio of each data states. For example, if memory cells connected to one word-line are multi-level cells (MLC) each storing 2-bit data, each of the memory cells has one of an erase state and first through third program states.

In this case, the randomizer 140 randomizes data of the memory cells connected to one word-line to balance the number of each data states of the memory cells. Thus, the number of memory cells having the erase state, the number of memory cells having the first program state, the number of memory cells having the second program state, and the number of memory cells having the third program state become substantially equal. The randomizer 140 de-randomizes data read from the nonvolatile memory device 200 to recover original data from the randomized data after reading out the data from the memory cells.

Alternatively, the randomizer 140 may randomize data on a page basis. For this embodiment, the randomizer 140 randomizes data for each states of memory cells to be approximately equal in numbers. Thus, the number of memory cells programmed into one state is similar to the number of memory cells to programmed into other state, though the numbers may not be same.

The memory controller 100 communicates with the host through the host interface 150. For example, the host interface 150 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer system interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The memory controller 100 communicates with the nonvolatile memory device 200 through the nonvolatile memory interface 170.

Figure 3:
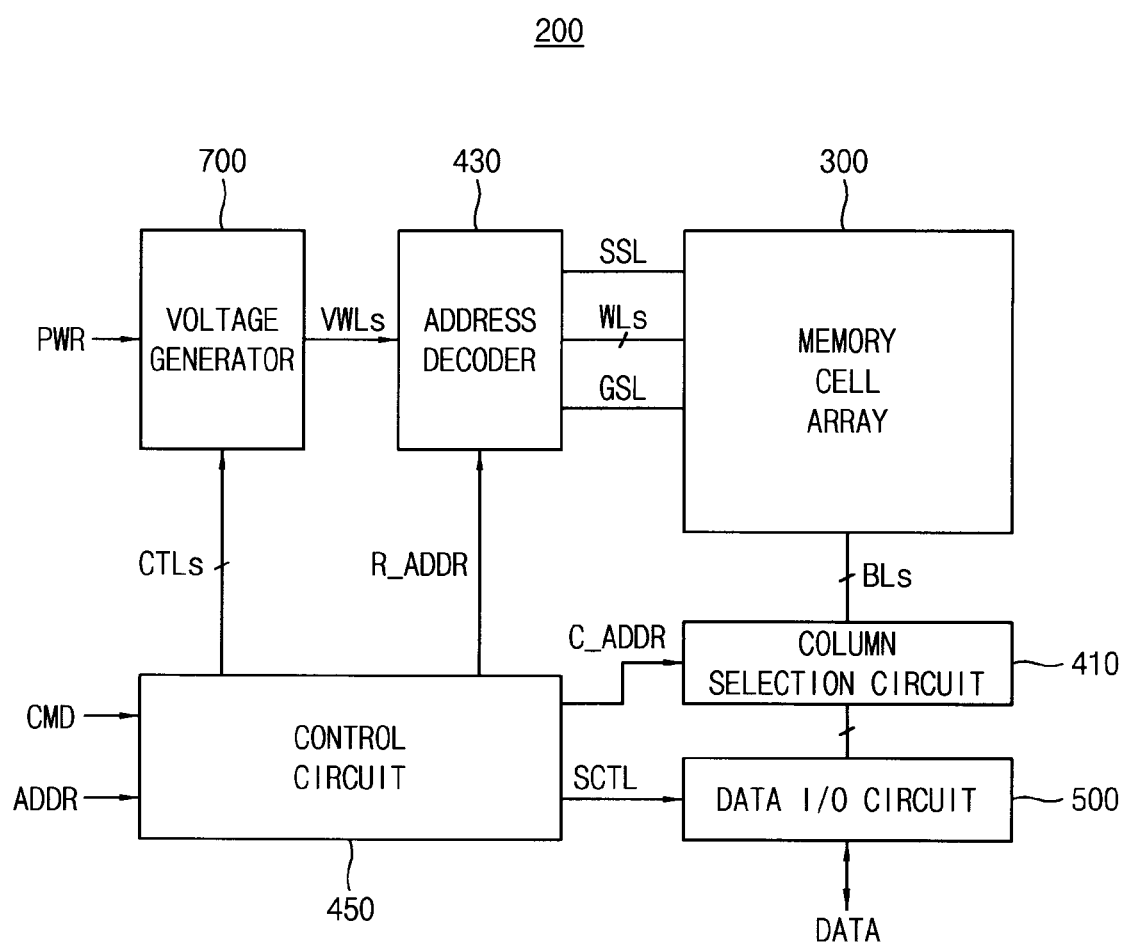
FIG. 3 is a block diagram illustrating the nonvolatile memory device in the memory system of FIG. 1 according to example embodiments.

FIG. 3 is a block diagram illustrating the nonvolatile memory device in the memory system of FIG. 1 according to example embodiments.

Referring to FIG. 3, the nonvolatile memory device 200 includes a memory cell array 300, an address decoder 430, a column selection circuit 410, a sensing (or, data input/output) circuit 500, a control circuit 450 and a voltage generator 700.

The memory cell array 300 may be coupled to the address decoder 430 through a string selection line SSL, a plurality of word-lines WLs, and a ground selection line GSL. In addition, the memory cell array 300 may be coupled to the column selection circuit 410 through a plurality of bit-lines BLs.

The memory cell array 300 may include a plurality of memory cells coupled to the plurality of word-lines WLs and the plurality of bit-lines BLs.

In some example embodiments, the memory cell array 300 may be a three-dimensional memory cell array, which is formed on a substrate in a three-dimensional structure (or a vertical structure). In this case, the memory cell array 300 may include vertical cell strings that are vertically oriented such that at least one memory cell is located over another memory cell. In other example embodiments, the memory cell array 300 may be a two-dimensional memory cell array, which is formed on a substrate in a two-dimensional structure (or a horizontal structure).

Figure 4:
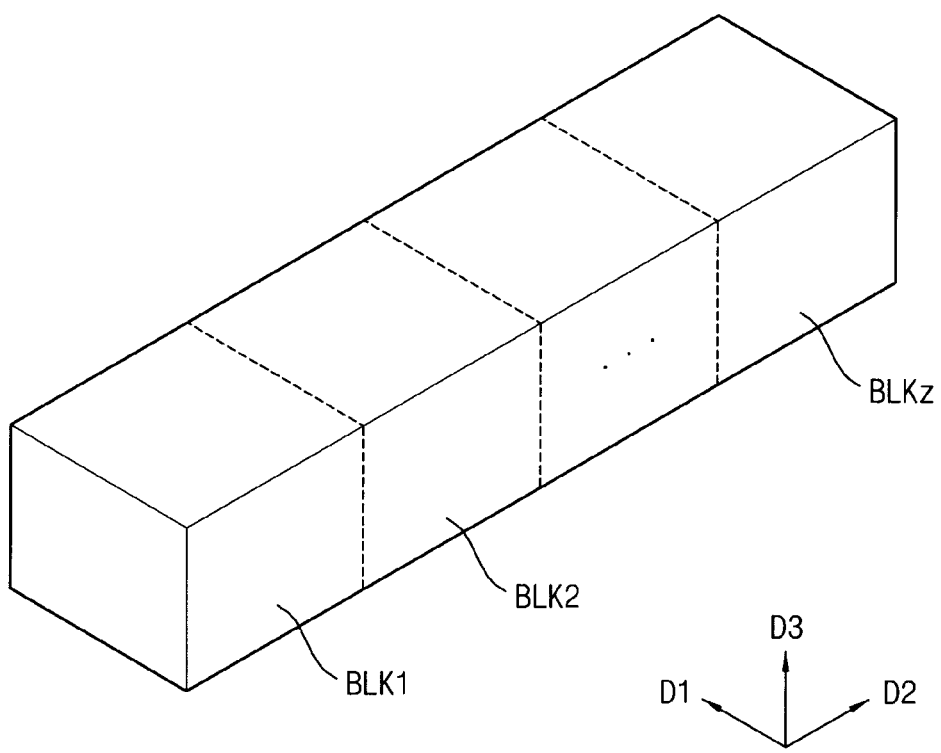
FIG. 4 is a block diagram illustrating the memory cell array in FIG. 3.

FIG. 4 is a block diagram illustrating the memory cell array in FIG. 3.

Referring to FIG. 4, the memory cell array 300 may include a plurality of memory blocks BLK1 to BLKz (z is a natural number greater than one) which extend along first through third directions D1, D2 and D3. In an embodiment, the memory blocks BLK1 to BLKz are selected by the address decoder 430 in FIG. 3. For example, the address decoder 430 may select a memory block BLK corresponding to a block address among the memory blocks BLK1 to BLKz.

Figure 5:
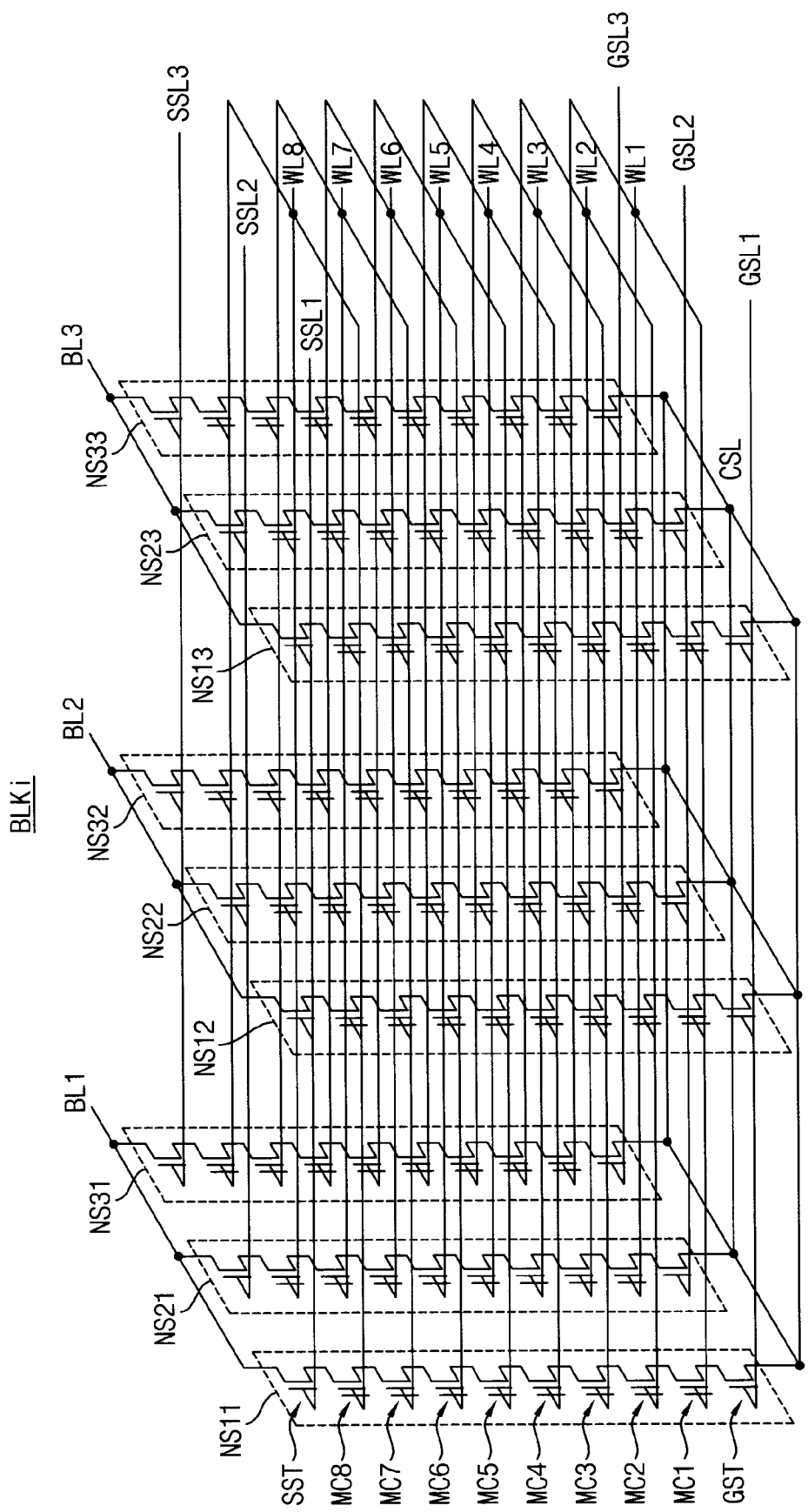
FIG. 5 is a circuit diagram illustrating one of the memory blocks in FIG. 4.

FIG. 5 is a circuit diagram illustrating one of the memory blocks in FIG. 4.

The memory block BLKi of FIG. 5 may be formed on a substrate in a three-dimensional structure (or a vertical structure). For example, a plurality of memory cell strings included in the memory block BLKi may be formed in a direction perpendicular to the substrate.

Referring to FIG. 5, the memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 5, each of the memory cell strings NS11 to NS33 is illustrated to include eight memory cells MC1 to MC8. However, example embodiments are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated.

Referring back to FIG. 3, the control circuit 450 may receive a command (signal) CMD and an address (signal) ADDR from the memory controller 100 and control an erase loop, a program loop and a read operation of the nonvolatile memory device 200 based on the command signal CMD and the address signal ADDR. The program loop may include a program operation and a program verification operation. The erase loop may include an erase operation and an erase verification operation.

For example, the control circuit 450 may generate control signals CTLs to control the voltage generator 700 and may generate a sensing control signal SCTL to control the sensing circuit 500 based on the command signal CMD. The control circuit 450 may generate a row address R_ADDR and a column address C_ADDR based on the address signal ADDR. The control circuit 450 may provide the row address R_ADDR to the address decoder 430 and provide the column address C_ADDR to the column selection circuit 410.

The address decoder 430 may be coupled to the memory cell array 300 through the string selection line SSL, the plurality of word-lines WLs, and the ground selection line GSL. During the program operation or the read operation, the address decoder 405 may determine one of the plurality of word-lines WLs as a selected word-line and determine rest of the plurality of word-lines WLs except for the selected word-line as unselected word-lines based on the row address R_ADDR.

The column selection circuit 410 may be coupled to the memory cell array 300 through the bit-lines BLs. The column selection circuit 410 may select one of the bit-lines BLs in response to the column address C_ADDR and may couple the selected bit-line to the sensing circuit 500. The column selection circuit 410 may include a plurality of selection transistors (bit-line selection transistors) coupled to the bit-lines BLs, respectively. The voltage generator 700 may apply a voltage with a first logic level (logic high level) to a gate of a selection transistor coupled to a selected bit-line and may apply a voltage with a second logic level (logic low level) to gates of selection transistors coupled to unselected bit-lines.

The sensing circuit 500 is coupled to the memory cell array 300 through the column selection circuit 410, may write the data DATA in the memory cell array 300, and may sense the data DATA stored in the memory cell array 300 to provide the data DATA to the memory controller 100.

The voltage generator 700 may generate word-line voltages VWLs, which are required for the operation of the nonvolatile memory device 200, based on the control signals CTLs received from the control circuit 450. The voltage generator 700 may receive the power PWR from the memory controller 100. The word-line voltages VWLs may be applied to the plurality of word-lines WLs through the address decoder 430.

For example, during the erase operation, the voltage generator 700 may apply an erase voltage to a well of the memory block and may apply a ground voltage to entire word-lines of the memory block. During the erase verification operation, the voltage generator 700 may apply an erase verification voltage to the entire word-lines of the memory block or sequentially apply the erase verification voltage to word-lines in a word-line basis.

For example, during the program operation, the voltage generator 700 may apply a program voltage to the selected word-line and may apply a program pass voltage to the unselected word-lines. In addition, during the program verification operation, the voltage generator 700 may apply a program verification voltage to the selected word-line and may apply a verification pass voltage to the unselected word-lines.

In addition, during the read operation, the voltage generator 700 may apply a default read voltage and an offset read voltage to the selected word-line and may apply a read pass voltage to the unselected word-lines.

In addition, during the read operation, the voltage generator 700 may apply a boost voltage to a selected word-line and a gate of a selection transistor coupled to a selected bit-line according to a temperature of the nonvolatile memory device 200 to increase sensing margin of on-cell and off-cell.

Figure 6:
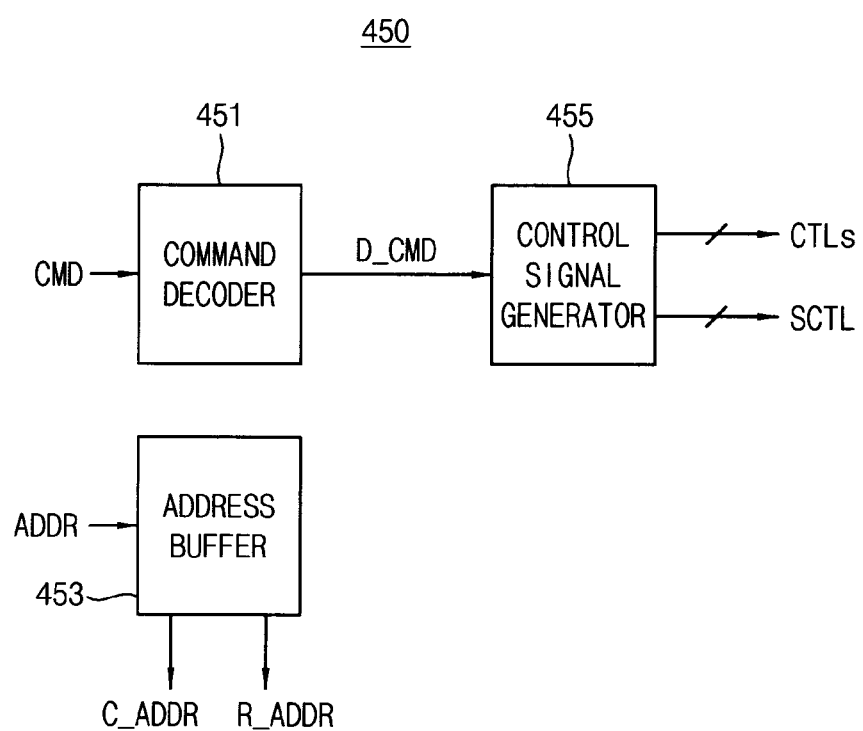
FIG. 6 is a block diagram illustrating the control circuit in the nonvolatile memory device of FIG. 3 according to example embodiments.

FIG. 6 is a block diagram illustrating the control circuit in the nonvolatile memory device of FIG. 3 according to example embodiments.

Referring to FIG. 6, the control circuit 450 includes a command decoder 451, an address buffer 453, and a control signal generator 455.

The command decoder 451 decodes the command CMD and provides a decoded command D_CMD to the control signal generator 455.

The address buffer 453 receives the address signal ADDR, provides the row address R_ADDR to the address decoder 430 and provides the column address C_ADDR to the column selection circuit 410 based on the address signal ADDR.

The control signal generator 455 receives the decoded command D_CMD, generates the control signals CTLs and the sensing control signal SCTL based on an operation directed by the decoded command D_CMD, provides the control signals CTLs to the voltage generator 700 and provides the sensing control signal SCTL to the sensing circuit 500.

Figure 7:
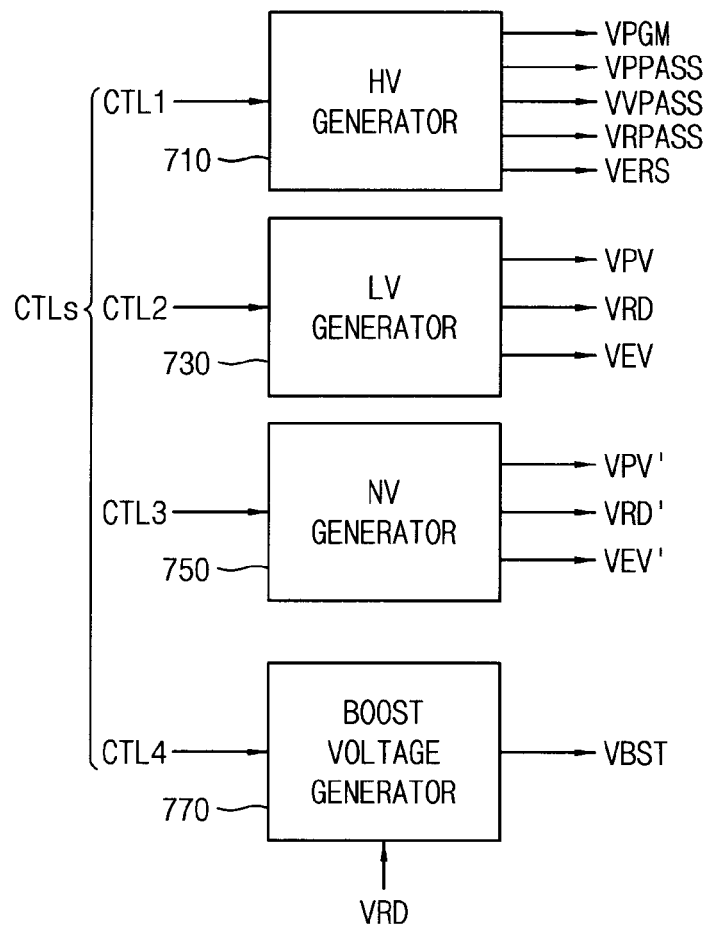
FIG. 7 is a block diagram illustrating the voltage generator in the nonvolatile memory device of FIG. 4 according to example embodiments.

FIG. 7 is a block diagram illustrating the voltage generator in the nonvolatile memory device of FIG. 4 according to example embodiments.

Referring to FIG. 7, the voltage generator 700 includes a high voltage generator 710 and a low voltage generator 730. The voltage generator 700 may further include a negative voltage generator 750 and a boost voltage generator 770.

The high voltage generator 710 may generate a program voltage PGM, a program pass voltage VPPASS, a verification pass voltage VVPASS, a read pass voltage VRPASS and an erase voltage VERS according to operations directed by the command CMD, in response to a first control signal CTL1 of the control signals CTLs.

The program voltage VPGM is applied to the selected word-line, the program pass voltage VPPASS, the verification pass voltage VVPASS, the read pass voltage VRPASS may be applied to the unselected word-lines and the erase voltage VERS may be applied to the well of the memory block. The first control signal CTL1 may include a plurality of bits which indicate the operations directed by the decoded command D_CMD.

The low voltage generator 730 may generate a program verification voltage VPV, an erase verification voltage VEV and a default read voltage VRD and offset read voltages VRDO1 and VRDO2 according to operations directed by the command CMD, in response to a second control signal CTL2 of the control signals CTLs. The program verification voltage VPV, the default read voltage VRD, the offset read voltages VRDO1 and VRDO2 and the erase verification voltage VEV may be applied to the selected word-line according to operation of the nonvolatile memory device 200. The second control signal CTL2 may include a plurality of bits which indicate the operations directed by the decode command D_CMD.

The negative voltage generator 750 may generate a program verification voltage VPV', a read voltage VRD' and an erase verification voltage VEV' which have negative voltage levels according to operations directed by the command CMD, in response to a third control signal CTL3 of the control signals CTLs. The third control signal CTL3 may include a plurality of bits which indicate the operations directed by the decoded command D_CMD.

The boost voltage generator 770 receives the default read voltage VRD, generates a boost voltage VBST based on the default read voltage VRD when a fourth control signal CTL4 designates a read operation and provides the boost voltage VBST to the gate of the selection transistor coupled to the selected bit-line and the selected word-line.

Figure 8:
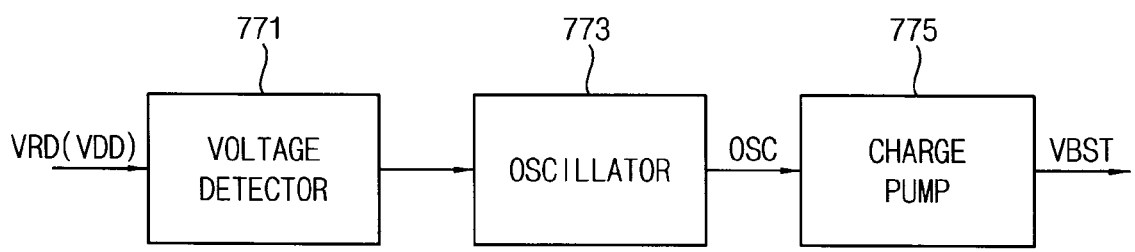
FIG. 8 is a block diagram illustrating an example of the boost voltage generator in the voltage generator of FIG. 7 according to example embodiments.

FIG. 8 is a block diagram illustrating an example of the boost voltage generator in the voltage generator of FIG. 7 according to example embodiments.

Referring to FIG. 8, the boost voltage generator 770 may include a voltage detector 771, an oscillator 773 and a charge pump 775.

The voltage detector 771 detects a level of the default read voltage VRD or the power supply voltage VDD. The oscillator 773 operates in response to the level detected by the voltage detector 771 and generates oscillation signals OSC that have complementary relationships with the detected voltage level. The charge pump 775 performs a pumping operation in response to the oscillation signals OSC to generate the boost voltage VBST. A level of the boost voltage VBST is higher than the default read voltage VRD.

Figure 9:
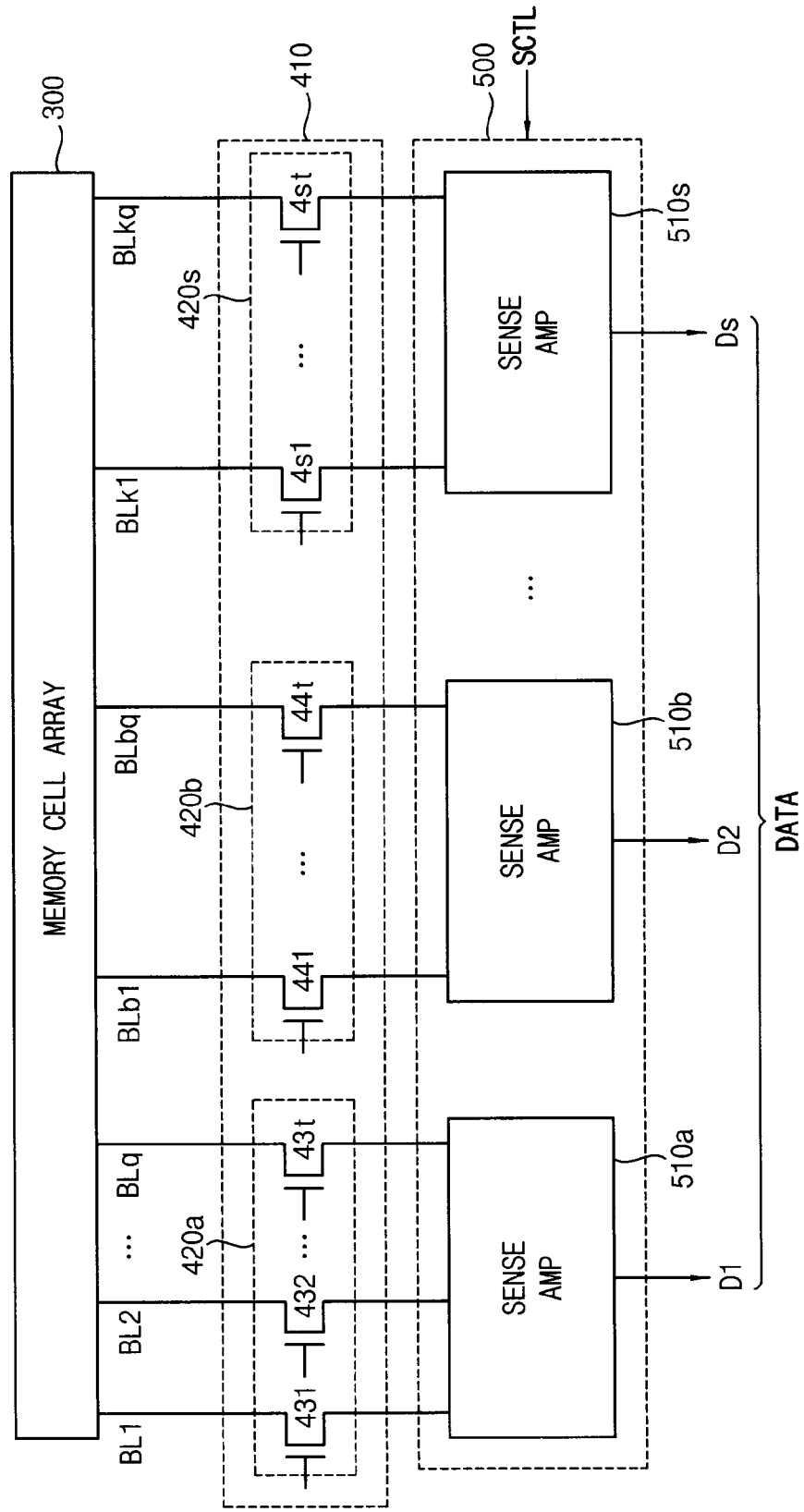
FIG. 9 illustrates a portion of the nonvolatile memory device 200 of FIG. 3 according to example embodiments.

FIG. 9 illustrates a portion of the nonvolatile memory device 200 of FIG. 3 according to example embodiments.

In FIG. 9, the memory cell array 300, the column selection circuit 410 and the sensing circuit 500 are illustrated.

The column selection circuit 410 may include a plurality of selection transistors 431~43t, 441~44t, 4s1~4st coupled to bit-lines BL1~BLq, BLb1~BLbq, BLk1~BLkq, respectively. For example, s is a natural number greater than four, and each of t and q is a natural number greater than seven. The selection transistors 431~-43t, 441~44t, 4s1~4st may be divided into a plurality of groups of selection transistors 420a, 420b, . . . , 420s. The first group of selection transistors 420a may be coupled to the corresponding bit-lines BL1~BLq, respectively. The second group of selection transistors 420b may be coupled to the corresponding bit-lines BLb1~BLbq, respectively. The third group of selection transistors 420s may be coupled to the corresponding bit-lines BLk1~BLkq, respectively. As an example, each of the bit line BLkq and the selection transistor 4st may be replaced with a different reference number. For example, the bit line BLkq may be BLm and the selection transistor 4st may be 4sm, a number of m may be different from a number of t or q.

The sensing circuit 500 may include a plurality of sense amplifiers (SENSE AMP) 510a, 510b, . . . , 510s corresponding to the plurality of groups 420a, 420b, . . . , 420s, respectively. The memory device 200 may store data DATA in the memory cell array 300 through corresponding one of the sense amplifiers 510a, 510b, . . . , 510s or may sense data stored in the memory cell array 300 through corresponding one of the sense amplifiers 510a, 510b, . . . , 510s to provide the data DATA to the memory controller 100. Each of the sense amplifiers 510a, 510b, . . . , 510s may output corresponding one of data bits D1~Ds of the data DATA.

Figure 10:
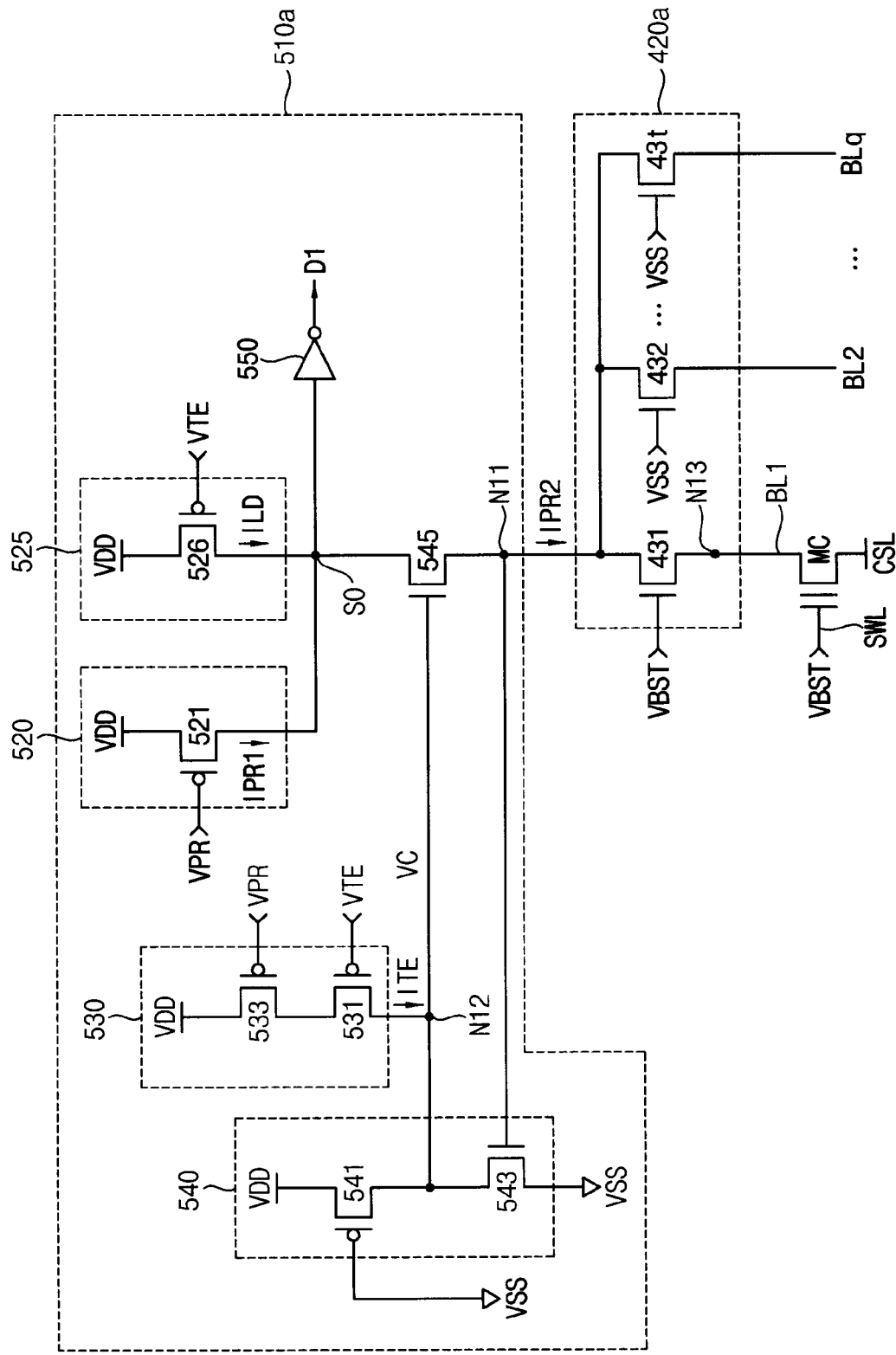
FIG. 10 illustrates one of sense amplifiers in the sensing circuit in FIG. 9 according to example embodiments.

FIG. 10 illustrates one of sense amplifiers in the sensing circuit in FIG. 9 according to example embodiments.

In FIG. 10, the first group of selection transistors 420a coupled to the sense amplifier 510a and a memory cell MC are illustrated together with the sense amplifier 510a.

Referring to FIG. 10, the sense amplifier 510a may include a precharge current generator 520, an adjusting transistor 545, an adaptive control voltage generator 530, a current adjusting circuit 540, an inverter 550, and a load current generator 525.

The precharge current generator 520 is connected to a sensing node SO, and the precharge current generator 520 generates a precharge current IPR1 provided to a bit-line BL1, in response to a precharge signal VPR. The precharge current generator 520 includes a p-channel metal oxide semiconductor (PMOS) transistor 521 which has a source coupled to the power supply voltage VDD, a gate receiving the precharge signal VPR and a drain coupled to the sensing node SO.

The adjusting transistor 545 is connected between the sensing node SO and a first node N11 coupled to the bit-line BL1, and the adjusting transistor 545 adjusts an amount of the precharge current IPR1 provided to the bit-line BL1 in response to a first control voltage VC to provide a precharge current IPR2 to the bit-line BL1 through the selection transistor 431. The adjusting transistor 545 may include an n-channel metal oxide semiconductor (NMOS) transistor which has a drain coupled to the sensing node SO, a gate receiving the first control voltage VC and a source coupled to the first node N11.

The adaptive control voltage generator 530 generates a control current ITE which is proportional to a temperature (e.g., operating temperature) of the nonvolatile memory device 200, in response to the precharge signal VPR and a second control voltage VTE and boosts a level of the first control voltage VC in proportion to the temperature, based on the control current ITE. The second control voltage VTE may be inversely proportional to the temperature.

The adaptive control voltage generator 530 includes first and second PMOS transistors 533 and 531 connected in series between the power supply voltage VDD and a second node N12. The first PMOS transistor 533 has a source coupled to the power supply voltage VDD, a gate receiving the precharge signal VPR and a drain coupled to the second PMOS transistor 531. The second PMOS transistor 531 has a source coupled to the first PMOS transistor 532, a gate receiving the second control voltage VTE and a drain coupled to the second node N12. The control current ITE is provided to the second node N12 coupled to the drain of the second PMOS transistor 531.

The second PMOS transistor 531 operates as a current source to output the control current ITE in response to the second control voltage VTE and the first PMOS transistor 533 adjusts a voltage provided to the second PMOS transistor 531 in response to the precharge signal VPR. Since the second control voltage VTE is inversely proportional to the temperature, the control current ITE is proportional to the temperature. Therefore, the first control voltage VC is proportional to the temperature, and thus the adaptive control voltage generator 530 boosts the first control voltage VC in proportion to the temperature. Accordingly, the adaptive control voltage generator 530 may increase a level of the first control voltage VC by increasing the control current ITE in response to increase of the temperature and may decrease the level of the first control voltage VC by decreasing the control current ITE in response to decrease of the temperature.

For example, since the first control voltage VC is proportional to the temperature, the level of the first control voltage VC decreases when the temperature of the nonvolatile memory device 200 is smaller than a reference voltage level (e.g., at low temperature). The adaptive control voltage generator 530 may prevent a bit-line, for example, a selected bit line BL1 coupled to on-cell from being over-precharged by decreasing the prehcarge current used for sensing on-cells at low temperature. Therefore, the nonvolatile memory device 200 may increase a speed of read operation at the low temperature.

For example, since the first control voltage VC is proportional to the temperature, the level of the first control voltage VC increases when the temperature of the nonvolatile memory device 200 is greater than the reference voltage level (e.g., at high temperature). The adaptive control voltage generator 530 may reduce a leakage current flowing through selection transistors 432-43t of the first group of selection transistors 420a coupled to unselected bit-lines, for example, BL2 to BLq. Therefore, the nonvolatile memory device 200 may increase the speed of read operation at the high temperature.

The current adjusting circuit 540 is coupled to the first node N11, is coupled to the adjusting transistor 545 and the adaptive control voltage generator 530 at the second node N12, and adjusts the control current ITE in response to a voltage level of the first node N11.

The current adjusting circuit 540 includes a PMOS transistor 541 and an NMOS transistor 543. The PMOS transistor 541 is connected between the power supply voltage VDD and the second node N12 and has a source coupled to the power supply voltage VDD, a gate coupled to a ground voltage VSS and a drain coupled to the second node N12. The NMOS transistor 543 is connected between the second node N12 and the ground voltage VSS and has a drain coupled to the second node N12, a gate coupled to the first node N11 and a source coupled to the ground voltage VSS.

Since the gate of the PMOS transistor 541 is coupled to the ground voltage VSS, the PMOS transistor 541 is always turned-on as long as the gate of the PMOS transistor 541 is coupled to the ground voltage VSS and the NMOS transistor 543 is selectively turned-on in response to a voltage of the first node N11. Therefore, a current sinking path from the NMOS transistor 543 to the ground voltage VSS is formed depending on the voltage of the first node N11 thereby to reduce the control current ITE and the current adjusting circuit 540 may prevent the precharge current IPR1 from being provided to the bit-line BL1 excessively.

The load current generator 525 includes a PMOS transistor 526. The PMOS transistor 526 has a source coupled to the power supply voltage VDD, a gate receiving the second control voltage VTE and the drain coupled to the sensing node SO. Since the level of the second control voltage VTE is inversely proportional to the temperature, the load current generator 525 may provide the sensing node SO with a load current ILD which is proportional to the temperature.

The ground voltage VSS is applied to gates of the selection transistors 432~43t coupled to unselected bit-lines, in the first group of selection transistors 420a. For example, the control circuit 450 may provide the column address C_ADDR with each bit having a level of the ground voltage VSS to the gates of the selection transistors 432-43t. Leakage current may be generated in the selection transistors 432-43t coupled to unselected bit-lines. Due to the leakage current, there is a limit to increase size of each of the selection transistors 431-43t. In addition, if the size of each of the selection transistors 431-43t is reduced for reducing the leakage current, sensing time may be increased.

Therefore, the load current ILD is generated for compensating the leakage current of the bit-line coupled to off-cell when sensing the off-cell, a magnitude of the load current ILD needs to be increased as the magnitude of the leakage of the bit-line increases. The increased load current ILD may decrease on-cell current that flows from the on-cell to the sensing node SO.

For preventing or reducing these phenomena, the adaptive control voltage generator 530 provides the adjusting transistor 545 with the first control voltage VC which is proportional to the temperature, and the voltage generator 700 provides the gate of the selection transistor 431 coupled to the selected bit-line BL1 and a selected word-line SWL coupled to the selected memory cell MC with the boost voltage VBST having a level greater than the power supply voltage VDD. Therefore, the sensing circuit 500 precharges the bit-line sufficiently with reducing leakage current at a high temperature and increases a read speed by preventing the bit-line from being overcharged at a low temperature. In addition, the sensing circuit 500 may ensure current margin of on-cell by boosting the word-line coupled to the selected memory cell.

Figure 11:
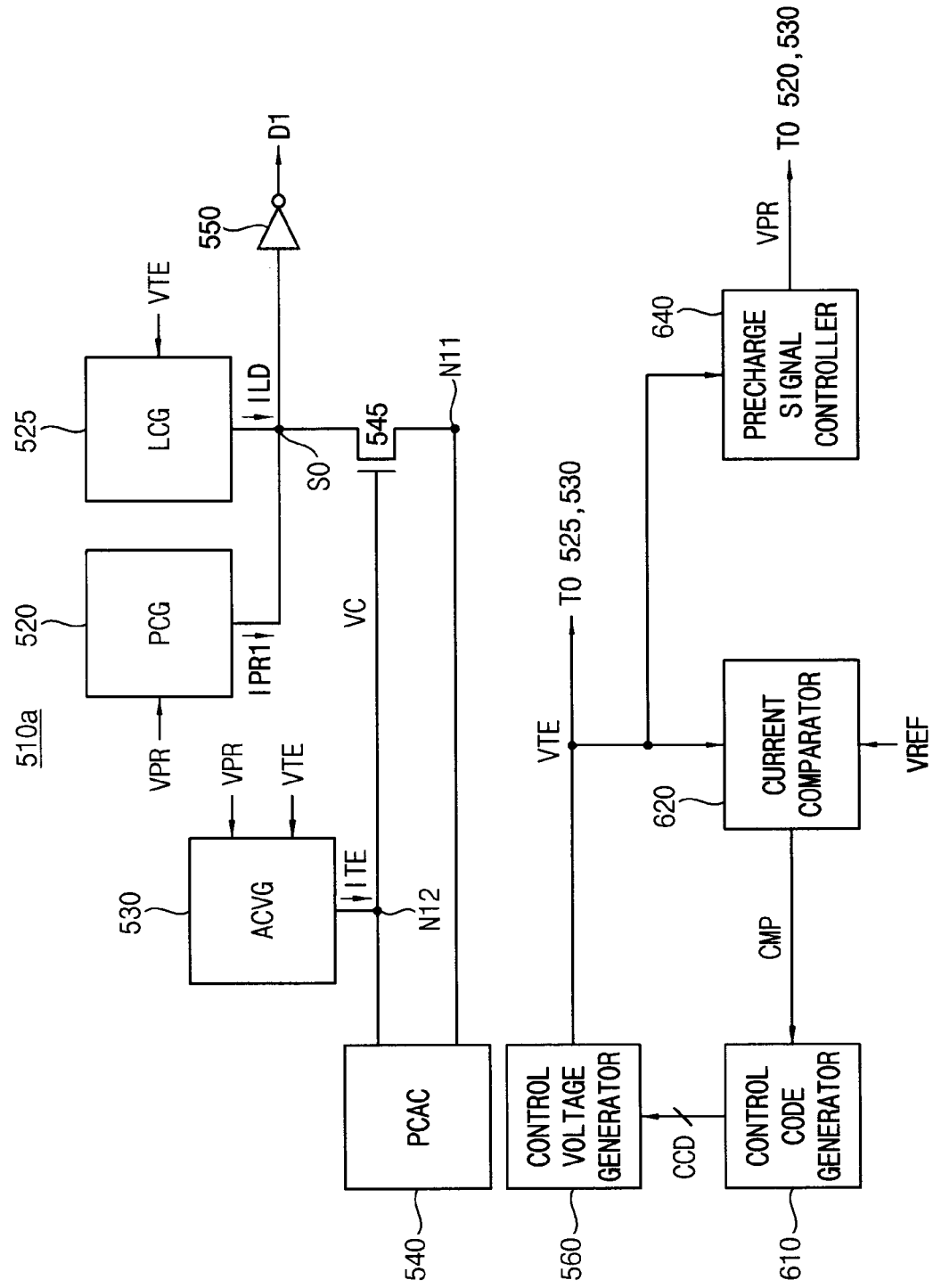
FIG. 11 illustrates in detail one of sense amplifiers in the sensing circuit in FIG. 9 according to example embodiments.

FIG. 11 illustrates in detail one of sense amplifiers in the sensing circuit in FIG. 9 according to example embodiments.

Referring to FIGS. 10 and 11, the sense amplifier 510a may include the precharge current generator (PCG) 520, the adjusting transistor 545, the adaptive control voltage generator (ACVG) 530, the current adjusting circuit PCAC 540, the inverter 550 and the load current generator (LCG) 525. As an example, the sense amplifier 510a may further include a control voltage generator 560, a control code generator 610, a current comparator 620 and a precharge signal controller 640. As another example, the control circuit 450 or the voltage generator 700 in FIG. 3 may include the control voltage generator 560, the control code generator 610, the current comparator 620 and the precharge signal controller 640.

The control voltage generator 560 generates a proportional to absolute temperature (PTAT) current, and generates the second control voltage VTE which is inversely proportional to the PTAT current. The control voltage generator 560 provides the second control voltage VTE to the adaptive control voltage generator 530, the load current generator 525, the current comparator 620 and the precharge signal controller 640.

The precharge signal controller 640 generates the precharge signal VPR and controls a pulse width of a precharge signal VPR based on the second control voltage VTE. The current comparator 620 receives a reference voltage VREF and the second control voltage VTE, generates a second load current based on the second control voltage VTE, and compares the second load current with a reference current and to generate a comparison signal CMP based on the comparison. The control code generator 610 generates a control code CCD based on the comparison signal CMP and provides the control code CCD to the control voltage generator 560.

Figure 12:
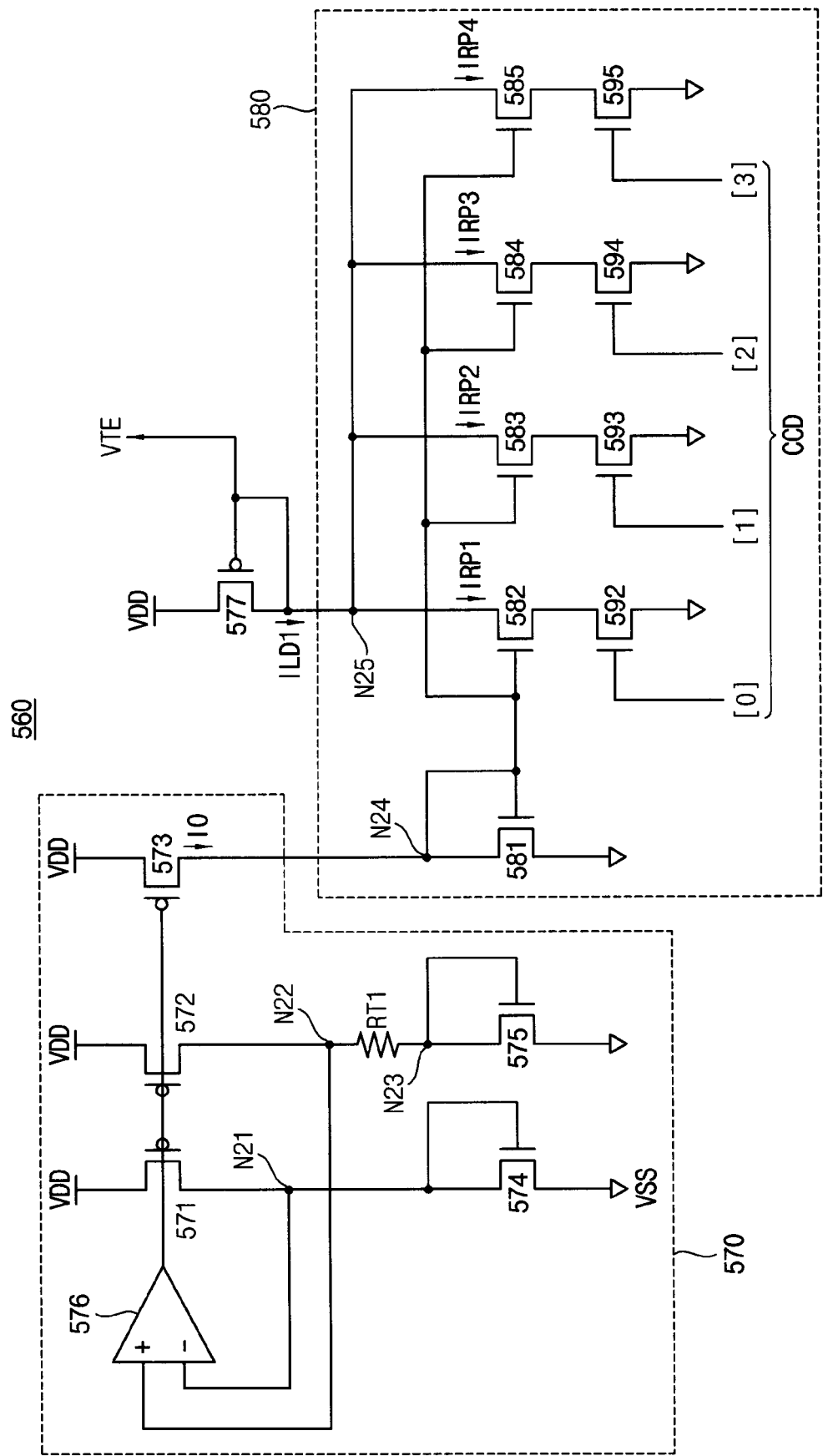
FIG. 12 is a circuit diagram illustrating an example of the control voltage generator in FIG. 11 according to example embodiments.

FIG. 12 is a circuit diagram illustrating an example of the control voltage generator in FIG. 11 according to example embodiments.

Referring to FIG. 12, the control voltage generator 560 may include a PTAT current source 570, a current mirror circuit 580, and a current-to-voltage converter 577.

The PTAT current source 570 may generate an output current IO which is proportional to the temperature. The PTAT current source 570 may include PMOS transistors 571, 572 and 573, NMOS transistors 574 and 575, a resistor RT1 and an amplifier 576.

The PMOS transistor 571 is connected between the power supply voltage VDD and a node N21, the PMOS transistor 572 is connected between the power supply voltage VDD and a node N22, and the PMOS transistor 573 is connected between the power supply voltage VDD and a node N24. The NMOS transistor 574 is diode-connected and is connected between the node N21 and the ground voltage VSS, the NMOS transistor 575 is diode-connected and is connected between a node N23 and the ground voltage VSS and the resistor RT1 is connected between the nodes N22 and N23. The amplifier 576 has a first input terminal coupled to the node N22, a second input terminal coupled to the node N21 and an output terminal coupled to a gate of each of the PMOS transistors 571, 572 and 573.

A voltage difference between the nodes N21 and N22 occurs due to the resistor RT1, and the amplifier 576 amplifies the voltage difference between the nodes N21 and N22 and outputs the amplified voltage to the gates of the PMOS transistors 571, 572 and 573. Each of the PMOS transistors 571, 572 and 573 is turned on or off based on the amplified voltage.

The output current IO generated by the PTAT current source 570 may be calculated based on Equation 1.

$$IO = VT*(\ln(n)/R1) = k*T/q*(\ln(n)/R1) \quad \text{[Equation 1]}$$

Here, VT refers to a thermal voltage, k refers to Boltzmann's constant, q refers to a charge amount of electron, T refers to an absolute temperature, n refers to the number of NMOS transistors 575 having the same W/L ratio and R1 refers to resistance of the resistor RT. As expressed in Equation 1, the PTAT current source 570 may generate an output current IO proportional to the absolute temperature T.

The current mirror circuit 580 is connected to the PTAT current source 570 at the node N24 and is connected to the current-to-voltage converter 577 at a node N25.

The current mirror circuit 580 includes an NMOS transistor 581 diode-connected to a first leg or a reference branch, and mirror branches included in a second leg. Each mirror branch may include each of NMOS transistors 582 to 585 and each of switches 592 to 595. Each of the switches 592 to 595 turns on/off in response to each bit included in the control code CCD and each of the NMOS transistors 582 to 585 operates as a current source according to ON/OFF of each of the switches 592 to 595 to provide replica currents IRP1, IRP2, IRP3 and IRP4, respectively. The current mirror circuit 580 may output a selected portion of the replica currents IRP1, IRP2, IRP3 and IRP4.

A ratio of the output current IO to the replica current IRP1 is determined according to a W/L ratio of the NMOS transistor 581 and a W/L ratio of the NMOS transistor 582, which is similarly to the replica currents IRP2, IRP3 and IRP4.

The current-to-voltage converter 577 may include a PMOS transistor connected between the power supply voltage VDD and the node N25. The PMOS transistor (or, the current-to-voltage converter) 577 senses the first load current ILD1 flowing in the node N25, and a gate voltage of the PMOS transistor 577 is the second control voltage VTE determined according to the first load current ILD1. For example, the current-to-voltage converter 577 converts the first load current ILD1 into the second control voltage VTE corresponding to a sum of selected portion of the replica currents IRP1, IRP2, IRP3 and IRP4.

Figure 13:
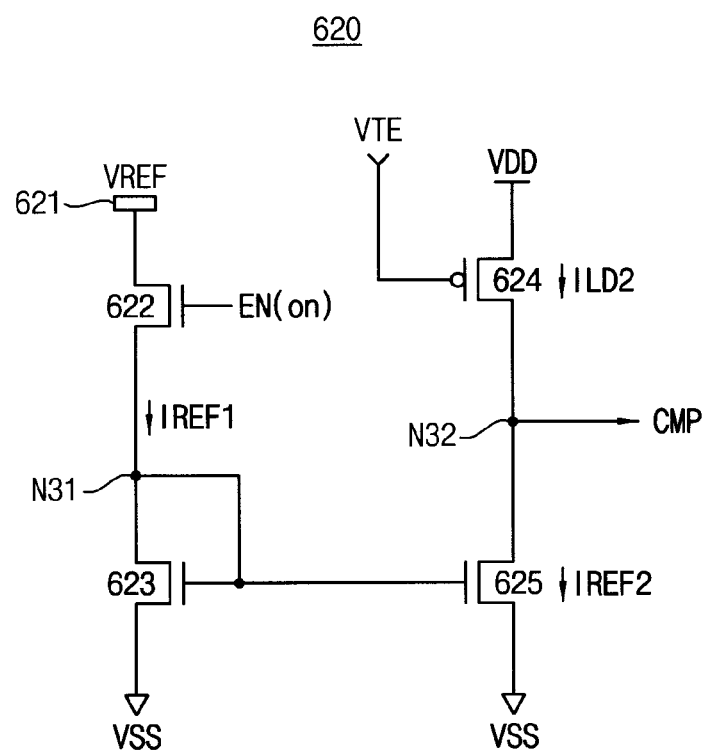
FIG. 13 is a circuit diagram illustrating an example of the current comparator in FIG. 11 according to example embodiments.

FIG. 13 is a circuit diagram illustrating an example of the current comparator in FIG. 11 according to example embodiments.

Referring to FIG. 13, the current comparator 620 include a pad (or pin) 621, a switch 622, a diode-connected NMOS transistor 623, an NMOS transistor 625, and a PMOS transistor 624. The pad 621 provides the reference voltage VREF supplied from the outside to the switch 622. In example embodiments, the reference voltage VREF may be supplied from an internal circuit, for example, a voltage generator in the nonvolatile memory device 200. The switch 622 is turned on or off in response to an enable signal EN, and outputs a first reference current IREF1 corresponding to the reference voltage VREF to a node N31 when the enable signal EN has a high level.

The diode-connected NMOS transistor 623 is connected between the N31 and the ground voltage VSS, the NMOS transistor 625 is connected between a node N32 and the ground voltage VSS, and a gate of the diode-connected NMOS transistor 623 and a gate of the NMOS transistor 625 are commonly connected to each other. When the first reference current IREF1 flows in the diode-connected NMOS transistor 623, the NMOS transistor 625 operates as a current source and outputs a second reference current IREF2. The amount of the first reference current IREF1 and an amount of the second reference current IREF2 may be the same as each other.

The PMOS transistor 624 is connected between the power supply voltage VDD and the node N32 and includes a gate for receiving the second control voltage VTE. The PMOS transistor 624 may generate a second load current ILD2 based on the second control voltage VTE. The amount of the first load current ILD1 and the amount of the second load current ILD2 may be the same as each other.

Therefore, the current comparator 620 may compare the second reference current IREF2 with the second load current ILD2 and output the comparison signal CMP to the control code generator 610. The control code generator 610 generates the control code CCD based on the comparison signal CMP and outputs the generated control code CCD to the control voltage generator 560. The control voltage generator 560 may adjust an amount of the PTAT current based on the control code CCD.

For example, when the amount of the second load current ILD2 is more than an amount of the second reference current IREF2, a voltage of the node N32 increases, and thus the comparison signal CMP has a high level. When the comparison signal CMP is at the high level, the control code generator 610 generates the control code CCD having a first value, and thus the control voltage generator 560 may decrease an amount of the PTAT current based on the control code CCD having the first value.

For example, when the amount of the second load current ILD2 is less than an amount of the second reference current IREF2, a voltage of the node N32 decreases, and thus the comparison signal CMP has a low level. When the comparison signal CMP is at the low level, the control code generator 610 generates the control code CCD having a second value, and thus the control voltage generator 560 may increase an amount of the PTAT current based on the control code CCD having the second value.

Figure 14:
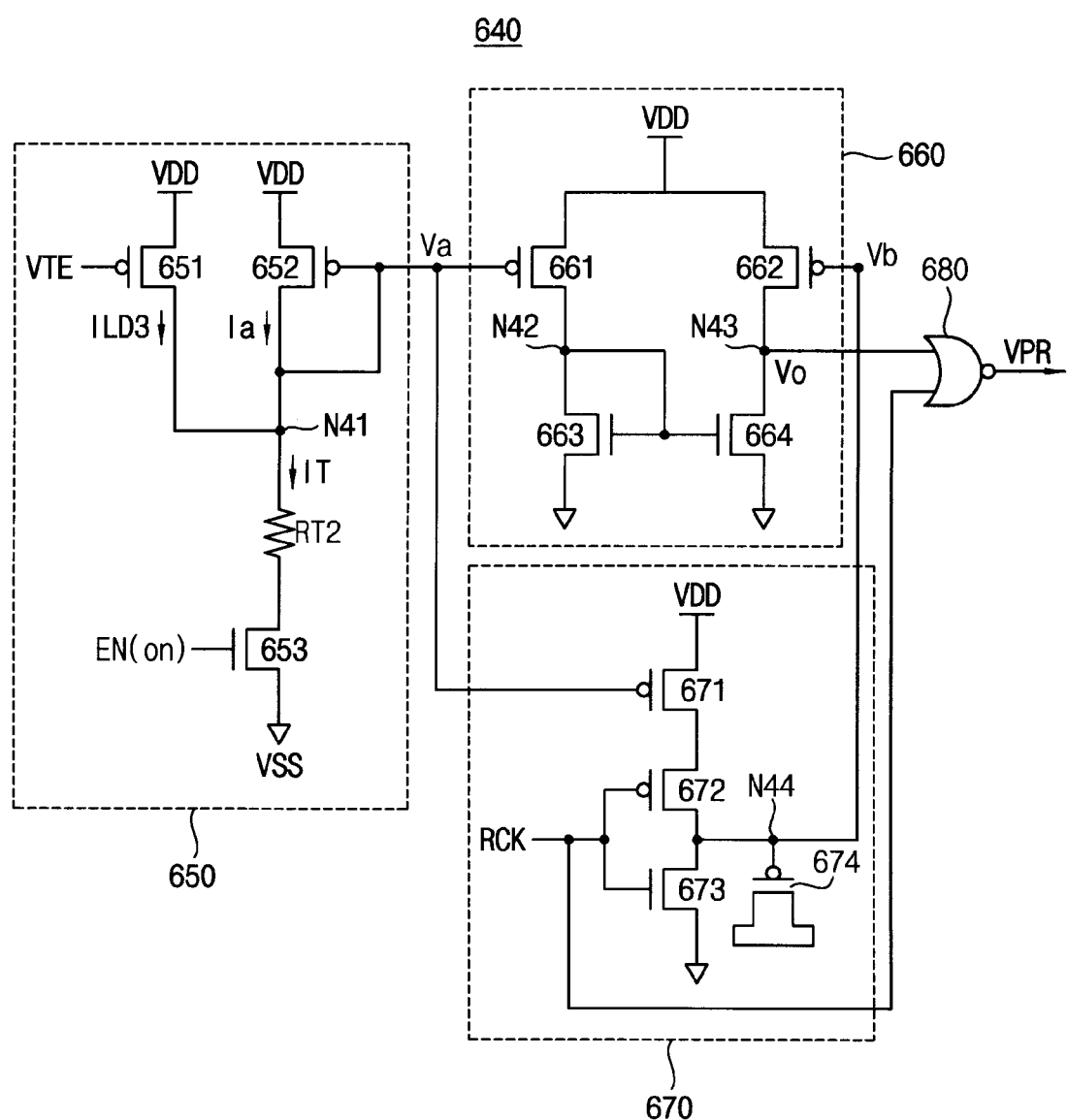
FIG. 14 is a circuit diagram illustrating an example of the precharge signal controller in FIG. 11 according to example embodiments.

FIG. 14 is a circuit diagram illustrating an example of the precharge signal controller in FIG. 11 according to example embodiments.

Referring to FIG. 14, the precharge signal controller 640 may include a first voltage generator 650, a second voltage generator 670, a differential amplifier 660, and a NOR gate 680.

The first voltage generator 650 generates a first voltage Va that has a level proportional to increase of the temperature, in response to the second control voltage VTE. The second voltage generator 670 charges a power supply voltage VDD therein based on a read clock signal RCK and the first voltage Va and to provide a charged voltage as a second voltage Vb. The differential amplifier 660 amplifies a difference of the first voltage Va and the second voltage Vb to output an output voltage Vo. The NOR gate 680 performs NOR operation on the output voltage Vo and the read clock signal RCK to output the precharge signal VPR.

The first voltage generator 650 may include PMOS transistors 651 and 652, a resistor RT2, and an NMOS transistor 653.

The PMOS transistor 651 is connected between the power supply voltage VDD and a node N41 and includes a gate for receiving the second control voltage VTE. The PMOS transistor 651 outputs a third load current ILD3 to the node N41 in response to the second control voltage VTE. The amount of the first load current ILD1 in FIG. 10 may be the same as an amount of the third load current ILD3.

The PMOS transistor 652 is connected between the power supply voltage VDD and the node N41, and a drain and a gate thereof are connected to each other. A first current Ia flowing in the PMOS transistor 652 may be calculated based on Equation 2.

$$Ia=\beta/2*(VDD-Va+Vth)^2 \qquad \text{[Equation 2]}$$

Here, β refers to a characteristic constant of the PMOS transistor 652 and Vth refers to a threshold voltage of the PMOS transistor 652.

The resistor RT2 and the NMOS transistor 653 are connected in series between the node N41 and the ground voltage VSS, and the NMOS transistor 653 is turned on/off in response to the enable signal EN. When the enable signal EN has a high level, a current IT flowing in the resistor RT2 may be calculated based on Equation 3.

$$IT=ILD3+Ia=Va/R2 \qquad \text{[Equation 3]}$$

Here, R2 denotes a resistance of the resistor RT2.

Referring to Equation 3, the first voltage generator 650 provides the first voltage Va proportional to the third load current ILD3 to the node N41. As a result, when temperature goes up, the first voltage Va increases, and when temperature goes down, the first voltage Va decreases.

The second voltage generator 670 may include PMOS transistors 671 and 672, an NMOS transistor 673, and a MOS capacitor 674. The PMOS transistors 671 and 672, and the NMOS transistor 673 are connected in series between the power supply voltage VDD and the ground voltage VSS, the PMOS transistor 671 has a gate receiving the first voltage Va, the PMOS transistor 672 has a gate receiving the read clock signal RCK and the NMOS transistor 673 has a gate receiving the read clock signal RCK. The MOS capacitor 674 is connected to a node N44 and the node N44 is connected between the PMOS transistor 672 and the NMOS transistor 673. The PMOS transistor 671 is turned on/off in response to the first voltage Va and the PMOS transistor 672 and the NMOS transistor 673 are turned on/off in response to the read clock signal RCK.

When the read clock signal RCK has a high level, the PMOS transistor 672 is turned off and the NMOS transistor 673 is turned on, and thus charges of the MOS capacitor 674 are discharged. When the read clock signal RCK is has a low level, the PMOS transistor 672 is turned on and the NMOS transistor 673 is turned off, and thus the MOS capacitor 674 is charged. The second voltage generator 670 may output a gate voltage of the MOS capacitor 674 as the second voltage Vb.

The differential amplifier 660 amplifies a difference between the first voltage Va and the second voltage Vb and output the output voltage Vo through an node N43 according to a result of the amplification. The differential amplifier 660 may include PMOS transistors 661 and 662 and NMOS transistors 663 and 664.

The PMOS transistor 661 has a source coupled to the power supply voltage VDD, a gate receiving the first voltage Va and a drain coupled to a node N42. The PMOS transistor 662 has a source coupled to the power supply voltage VDD, a gate receiving the second voltage Vb and a drain coupled to the node N43. The NMOS transistor 663 is diode-connected and is coupled to the node N42 and the ground voltage VSS and the NMOS transistor 664 is coupled to the node N43 and the ground voltage VSS and has a gate coupled to the node N42.

The NOR gate 680 performs NOR operation on the output voltage Vo and the read clock signal RCK to output the precharge signal VPR.

Figure 15:
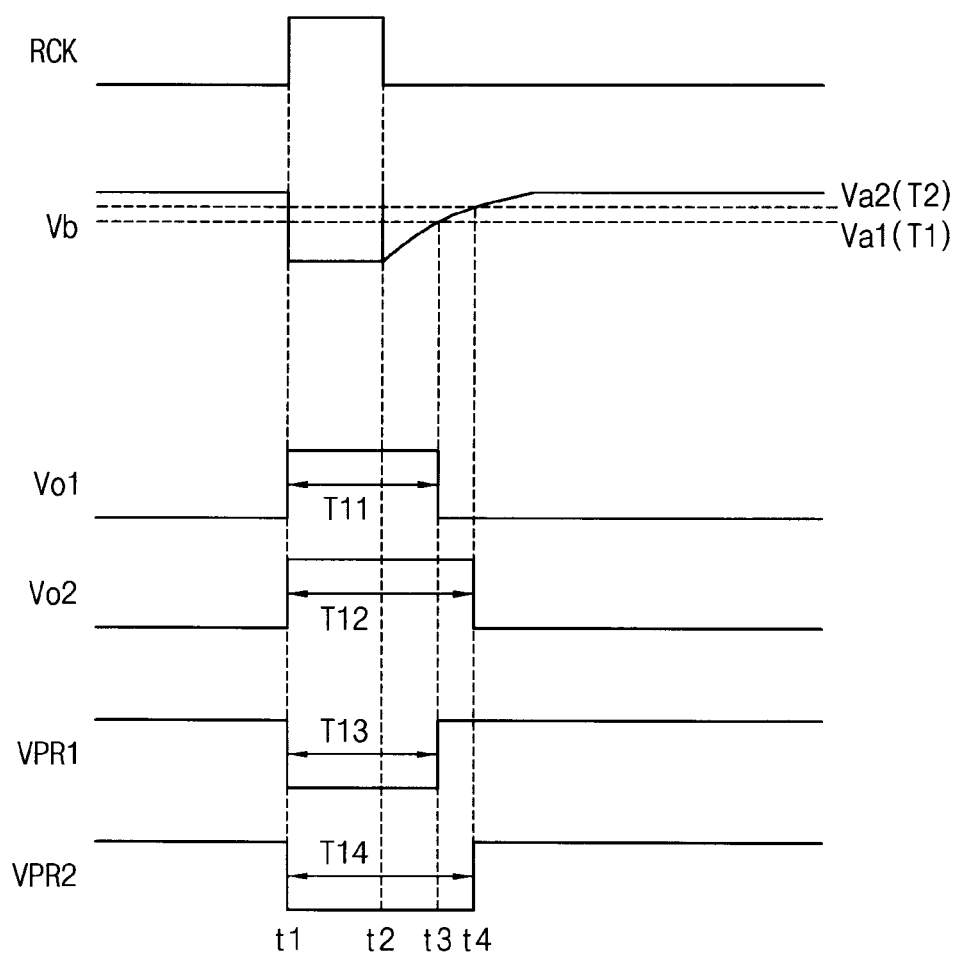
FIG. 15 is a timing diagram for describing an operation of precharge signal controller of FIG. 14.

FIG. 15 is a timing diagram for describing an operation of precharge signal controller of FIG. 14.

Referring to FIGS. 14 and 15, a first voltage Va1, a first output voltage Vo1, and a first precharge signal VPR1 are defined when the temperature of the nonvolatile memory device 200 is a first temperature T1. Further, a first voltage Va2, a second output voltage Vo2, and a second precharge signal VPR2 are defined when the temperature of the nonvolatile memory device 200 is a second temperature T2. The second temperature T2 is higher than the first temperature T1. A first time interval T11 refers to an interval between intersections t1 and t3 of the first voltage Va1 associated with the temperature T1 and the second voltage Vb, and a second time interval T12 refers to an interval between intersections t1 and t4 of the first voltage Va2 associated with temperature T2 and the second voltage Vb.

When the read clock signal RCK rises to a high level from a low level at a first time point t1, the MOS capacitor 674 is discharged. When the read clock signal RCK falls to the low level from the high level at a second time point t2, the MOS capacitor 674 is charged.

At the first temperature T1, the differential amplifier 660 compares a level of the first voltage Va1 associated with the first temperature T1 with a level of the second voltage Vb and generates the first output voltage Vo1 having a pulse width corresponding to the first time interval T11 according to a result of the comparison. The NOR gate 680 performs the NOR operation on the first output voltage Vo1 and the read clock signal RCK, and outputs a first precharge signal VPR1 having a pulse width corresponding to a third time interval T13.

At the second temperature T2, the differential amplifier 660 compares a level of the first voltage Va2 associated with the second temperature T2 with a level of the second voltage Vb and generates a second output voltage Vo2 having a pulse width corresponding to the second time interval T12 according to a result of the comparison. The NOR gate 680 performs the NOR operation on the second output voltage Vo2 and the read clock signal RCK, and outputs a second pre-charge signal VPR2 having a pulse width corresponding to a fourth time interval T14.

When the temperature of the nonvolatile memory device 200 goes up, a level of the first voltage Va increases and thus a pulse width of the precharge signal VPR increases, and when the temperature of the nonvolatile memory device 200 goes down, the level of the first voltage Va decreases, and thus the pulse width of the precharge signal VPR decreases. Accordingly, the nonvolatile memory device 200 may pre-charge the bit-line sufficiently by a greater pulse width of the precharge signal VPR at a high temperature and prevent the bit-line from being overcharged by a smaller pulse width of the precharge signal VPR at a low temperature.

Figure 16:
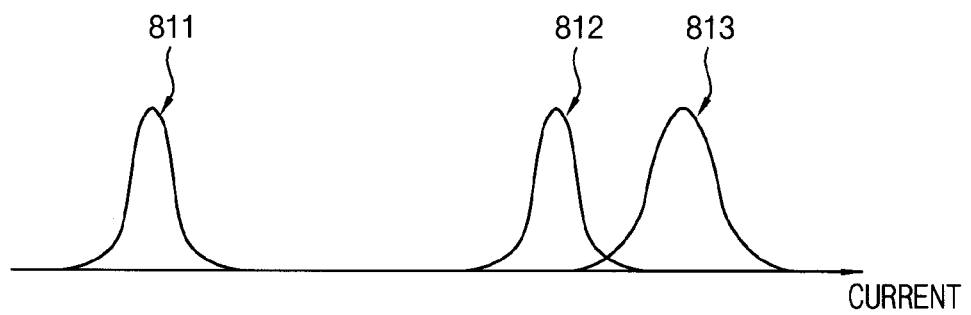
FIGS. 16 to 18 are graphs for describing sensing margin improvement effects of the nonvolatile memory device according to example embodiments.
Figure 17:
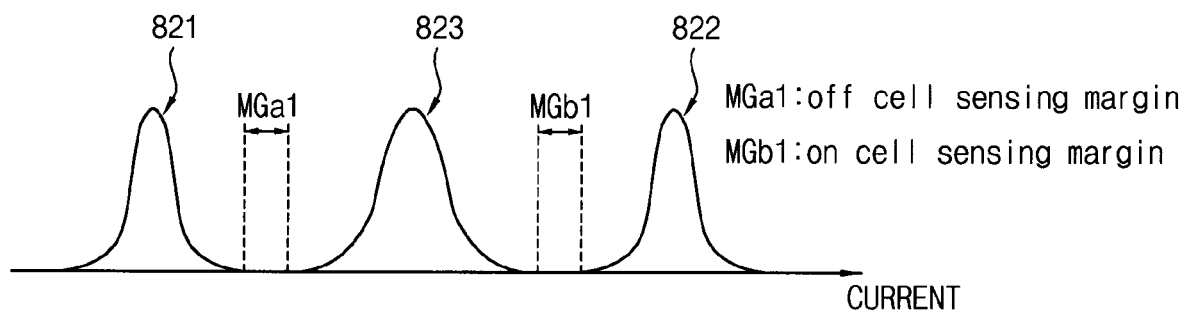
Figure 18:
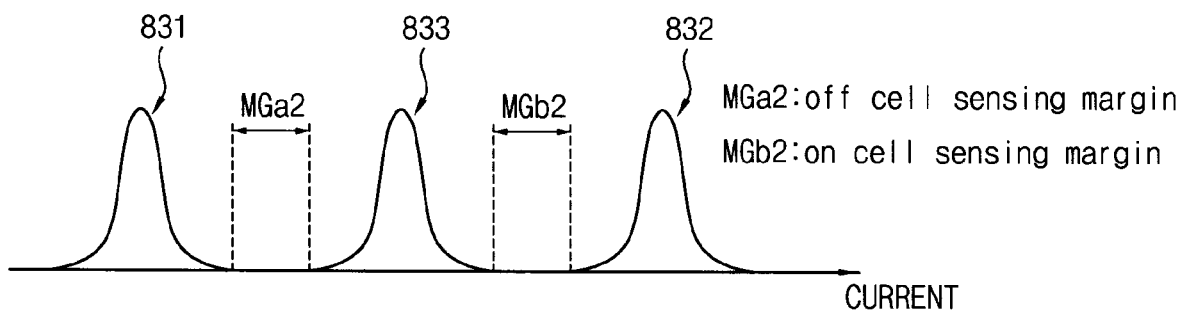

FIGS. 16 to 18 are graphs for describing sensing margin improvement effects of the nonvolatile memory device according to example embodiments.

FIG. 16 represents a sensing margin when the sense amplifier 510a of the sensing circuit 500 in the nonvolatile memory device 200 only includes the adjusting transistor 545, the inverter 550, the precharge current generator 520, and the load current generator 525. In this case, the load current generator 525 may have a gate coupled to the ground voltage VSS. Referring to FIG. 16, distributions of off-cell current 811, on-cell current 812 and a load current 813. When an amount of load currents becomes more than an amount of on-cell currents at a high operation voltage, there may be no off-cell sensing margin and on-cell sensing margin. The off-cell sensing margin represents a current margin used for sensing a memory cell as an off-cell, and the on-cell sensing margin represents a current margin used for sensing a memory cell as an on-cell.

FIG. 17 represents a sensing margin when the sense amplifier 510a of the sensing circuit 500 in the nonvolatile memory device 200 only includes the adjusting transistor 545, the inverter 550, the precharge current generator 520, and the load current generator 525. In this case, the load current generator 525 may have a gate receiving the second control voltage VTE generated by the control voltage generator 560. Referring to FIG. 17, distributions of off-cell current 821, on-cell current 822 and a load current 823. The sensing circuit may compensate for a leakage current of the bit-line using a load current proportional to temperature but distribution of the load current is widened due to changes of resistance and process, and thus an off-cell sensing margin MGa1 and an on-cell sensing margin MGb1 appear narrow.

FIG. 18 represents a sensing margin when the sense amplifier 510a of the sensing circuit 500 in the nonvolatile memory device 200 at least includes the adjusting transistor 545, the inverter 550, the precharge current generator 520, the load current generator 525, the adaptive control voltage generator 530 and the current adjusting circuit 540. Referring to FIG. 18, distributions of off-cell current 831, on-cell current 832 and a load current 833. The sensing circuit 500 may compensate for a leakage current of the bit-line by adaptively adjusting the amount of the precharge current IPR1 provided to the bit-line depending on change of the temperature and boosting voltages applied to a gate of the selection transistor 431 and the selected word-line SWL coupled to the selected memory cell MC, and thus an off-cell sensing margin MGa2 and an on-cell sensing margin MGb2 appear wide.

Figure 19:
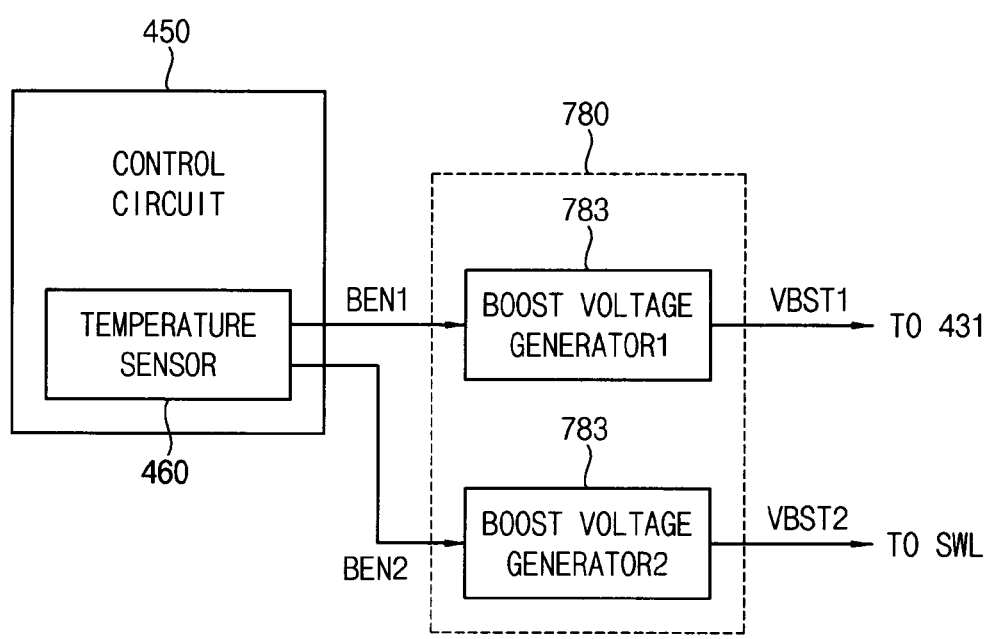
FIG. 19 illustrates a portion of the nonvolatile memory device of FIG. 3.

FIG. 19 illustrates a portion of the nonvolatile memory device of FIG. 3.

Referring to FIG. 19, the control circuit 450 includes a temperature sensor 460, and a boost voltage generator 780 included in the voltage generator 700 may include a first boost voltage generator 781 and a second boost voltage generator 783.

In example embodiments, the temperature sensor 460 senses the temperature of the nonvolatile memory device 200, compares the sensed temperature with a reference range (or, a reference temperature), and provides a first enable signal BEN1 to the first boost voltage generator 781 to enable the first boost voltage generator 781 when the sensed temperature is higher than the reference range. For example, the reference range may be 25° C.~30° C. The enabled first boost voltage generator 781 provides a first boost voltage VBST1 greater than the power supply voltage VDD to a gate of the selection transistor 431 coupled to the selected bit-line. The temperature sensor 460 provides a second enable signal BEN2 to the second boost voltage generator 783 to enable the second boost voltage generator 783 when the sensed temperature is lower than the reference range. The enabled second boost voltage generator 783 provides a second boost voltage VBST2 to the selected word-line SWL coupled to a selected page.

Figure 20:
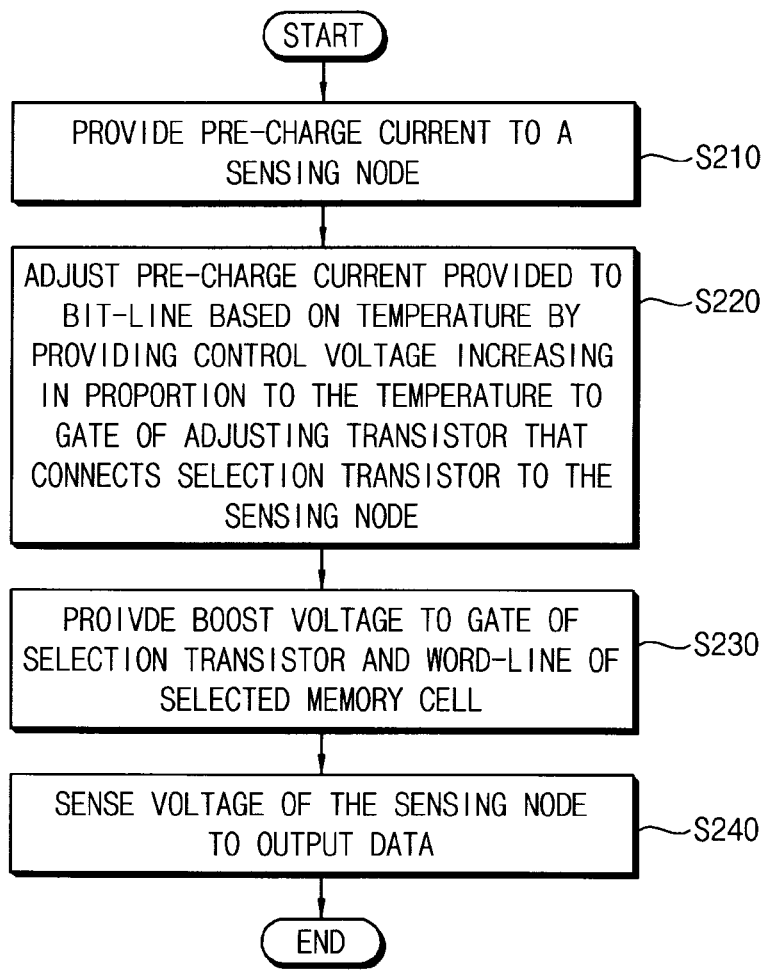
FIG. 20 is a flow chart illustrating a method of operating a nonvolatile memory device according to example embodiments.

FIG. 20 is a flow chart illustrating a method of operating a nonvolatile memory device according to example embodiments.

Referring to FIG. 20, there is provided a method of operating a nonvolatile memory device 200. The nonvolatile memory device 200 includes a memory cell array including a plurality of memory cells coupled to a plurality of word-lines and a plurality of bit-lines, a column selection circuit 410 including a plurality of selection transistors coupled to the bit-lines, respectively, and a sensing circuit 500 connected to the column selection circuit 410. In the method, the sensing circuit 500 provides a precharge current IPR1 to a sensing node (S210). The sensing circuit 500 adjusts the precharge current IPR1 provided to a selected bit-line among the bit-lines according to a temperature of the nonvolatile memory device 200 by applying a first control voltage VC to a gate of an adjusting transistor 545 that connects the sensing node SO to a first group of selection transistors among the selection transistors (S220). A level of the first control voltage increases in proportional to the temperature.

A voltage generator 700 applies a boost voltage VBST greater than a power supply voltage VDD to a first selection transistor 431 and a first word-line SWL (S230). The first selection transistor 431 of the first group of selection transistors is coupled to the selected bit-line and the first word-line SWL is coupled to a selected memory cell. The sensing circuit 500 senses a voltage of the sensing node SO to output data D1 (S240).

Figure 21:
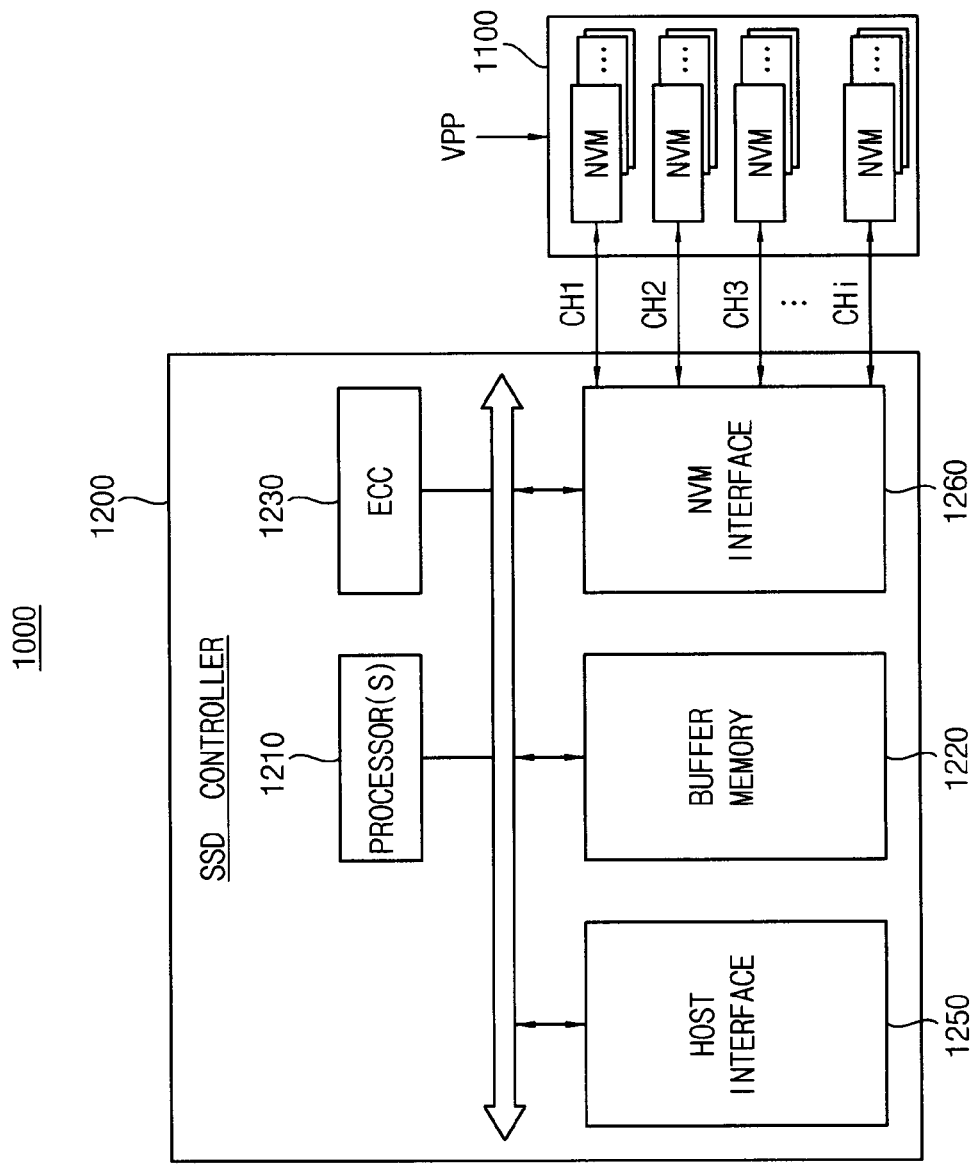
FIG. 21 is a block diagram illustrating a solid state disk or solid state drive (SSD) according to example embodiments.

FIG. 21 is a block diagram illustrating a solid state disk or solid state drive (SSD) according to example embodiments.

Referring to FIG. 21, an SSD 1000 includes multiple nonvolatile memory devices 1100 and an SSD controller 1200.

The nonvolatile memory devices 1100 may be optionally supplied with an external high voltage (or a second power supply voltage) VPP. Each of the nonvolatile memory devices 1100 may include the nonvolatile memory device 200 of FIG. 3. For example, each of the nonvolatile memory devices 1100 increase sensing margin and speed of read operation by providing a preacharge current which is adjusted depending on temperature, to a bit-line in a read operation.

The SSD controller 1200 is connected to the nonvolatile memory devices 1100 through multiple channels CH1 to CHi. The SSD controller 1200 includes one or more processors 1210, a buffer memory 1220, an error correction code (ECC) block 1230, a host interface 1250, and a nonvolatile memory interface 1260.

The buffer memory 1220 stores data used to drive the SSD controller 1200. The buffer memory 1220 includes multiple memory lines each storing data or a command. The ECC block 1230 calculates error correction code values of data to be programmed at a writing operation and corrects an error of read data using an error correction code value at a read operation. In a data recovery operation, The ECC block 1230 corrects an error of data recovered from the nonvolatile memory devices 1100.

The nonvolatile memory device or the storage device according to example embodiments may be packaged using various package types or package configurations.

The present disclosure may be applied to various electronic devices including the nonvolatile memory device disclosed above.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A sensing circuit of nonvolatile memory device, the sensing circuit comprising:
a precharge current generator connected to a sensing node, the precharge current generator configured to generate a precharge current provided to a bit-line of the nonvolatile memory device, in response to a precharge signal;
an adjusting transistor connected between the sensing node and a first node coupled to the bit-line, the adjusting transistor configured to adjust an amount of the precharge current provided to the bit-line in response to a first control voltage; and
an adaptive control voltage generator configured to generate a control current which is proportional to an operating temperature of the nonvolatile memory device, in response to the precharge signal and a second control voltage and configured to boost a level of the first control voltage in proportion to the operating temperature, based on the control current, wherein the second control voltage is inversely proportional to the operating temperature.

2. The sensing circuit of claim 1, further comprising:
a current adjusting circuit connected to the first node and connected to the adjusting transistor and the adaptive control voltage generator at a second node, the current adjusting circuit configured to adjust the control current to be provided to the second node in response to a voltage of the first node.

3. The sensing circuit of claim 2, wherein the adaptive control voltage generator includes first and second p-channel metal oxide semiconductor (PMOS) transistors connected in series between a power supply voltage and the second node,
wherein the first PMOS transistor includes a source coupled to the power supply voltage, a gate receiving the precharge signal and a drain coupled to the second PMOS transistor,
wherein the second PMOS transistor includes a source coupled to the first PMOS transistor, a gate receiving the second control voltage and a drain coupled to the second node, and
wherein the second PMOS transistor is configured to provide the control current to the second node in response to the second control voltage.

4. The sensing circuit of claim 3, wherein the adaptive control voltage generator is configured to:
increase a level of the first control voltage by increasing the control current in response to increase of the operating temperature, and
decrease a level of the first control voltage by decreasing the control current in response to decrease of the operating temperature.

5. The sensing circuit of claim 2, wherein the adjusting transistor includes an n-channel metal oxide semiconductor (NMOS) transistor that has a drain coupled to the sensing node, a gate coupled to the second node and a source coupled to the first node, and
wherein the adjusting transistor is configured to increase an amount of the precharge current provided to the bit-line according to increase of the operating temperature, in response to the first control voltage.

6. The sensing circuit of claim 2, wherein the current adjusting circuit includes:
a p-channel metal oxide semiconductor (PMOS) transistor connected between a power supply voltage and the second node; and
an n-channel metal oxide semiconductor (NMOS) transistor connected between the second node and a ground voltage,
wherein the PMOS transistor includes a source coupled to the power supply voltage, a gate coupled to the ground voltage and a drain coupled to the second node,
wherein the NMOS transistor includes a drain coupled to the second node, a gate coupled to the first node and a source coupled to the ground voltage, and
wherein the NMOS transistor is turned-on in response to a voltage of the first node to decrease a level of the first control voltage.

7. The sensing circuit of claim 2, furthering comprising:
a load current generator connected to the sensing node in parallel with the precharge current generator, wherein the load current generator is configured to generate a load current to be provided to the bit-line in response to the second control voltage,
wherein the load current generator includes a p-channel metal oxide semiconductor (PMOS) transistor and is configured to provide the sensing node with the load current which increases in proportion to increase of the operating temperature, in response to the second control voltage.

8. The sensing circuit of claim 2, further comprising:
a control voltage generator configured to generate an output current proportional to absolute temperature (PTAT) current, and the second control voltage inversely proportional to the PTAT current; and
a precharge signal controller configured to generate the precharge signal, and control a pulse width of the precharge signal based on the second control voltage.

9. The sensing circuit of claim 8, wherein the control voltage generator includes:
a PTAT current source configured to generate the output current;
a current mirror circuit connected to the PTAT current source, wherein the current mirror circuit is configured to generate a plurality of replica currents by mirroring the output current and configured to output at least selected portion of the replica currents based on a control code; and
a current to voltage converter connected to the current mirror circuit, wherein the current to voltage converter is configured to convert a first load current corresponding to the selected portion of the replica currents to the second control voltage.

10. The sensing circuit of claim 9, wherein the current mirror circuit is configured to increase the first load current in response to increase of the operating temperature.

11. The sensing circuit of claim 9, further comprising:
a current comparator configured to generate a second load current based on the second control voltage, to compare the second load current with a reference current and to generate a comparison signal based on the comparison; and
a control code generator configured to generate the control code based on the comparison signal.

12. The sensing circuit of claim 8, wherein the precharge signal controller includes:
a first voltage generator configured to generate a first voltage that has a level proportional to increase of the operating temperature, in response to the second control voltage;
a second voltage generator configured to charge a power supply voltage therein based on a read clock signal and the first voltage and to provide a charged voltage as a second voltage;
a differential amplifier configured to amplify a difference of the first voltage and the second voltage to generate an output voltage; and
a NOR gate configured to perform NOR operation on the output voltage and the read clock signal to output the precharge signal.

13. The sensing circuit of claim 12, wherein the precharge signal controller is configured to:
increase the pulse width of the precharge signal in response to increase of the operating temperature, and
decrease the pulse width of the precharge signal in response to decrease of the operating temperature.

14. A nonvolatile memory device comprising:
a memory cell array including a plurality of memory cells coupled to a plurality of word-lines and a plurality of bit-lines;
a column selection circuit including a plurality of selection transistors coupled to the bit-lines, respectively;
a sensing circuit connected to the column selection circuit; and
a control circuit configured to control the column selection circuit and the sensing circuit based on a command and an address,
wherein the sensing circuit includes:
a precharge current generator connected to a sensing node and configured to generate a precharge current provided to a first bit-line of the plurality of bit-lines, in response to a precharge signal;
an adjusting transistor connected between the sensing node and a first node coupled to the first bit-line, the adjusting transistor configured to adjust an amount of the precharge current provided to the first bit-line in response to a first control voltage; and
an adaptive control voltage generator configured to generate a control current which is proportional to an operating temperature of the nonvolatile memory device, in response to the precharge signal and a second control voltage and configured to boost a level of the first control voltage in proportion to the operating temperature, based on the control current,
wherein the second control voltage is inversely proportional to the operating temperature.

15. The nonvolatile memory device of claim 14, further comprising:
a current adjusting circuit connected to the first node and connected to the adjusting transistor and the adaptive control voltage generator at a second node, the current adjusting circuit configured to adjust the control current to be provided to the second node in response to a voltage of the first node,
wherein the first node is connected to a first group of selection transistors among the plurality of selection transistors and is connected to the first bit-line through a first selection transistor selected from among the first group of selection transistors.

16. The nonvolatile memory device of claim 15, wherein the adaptive control voltage generator includes first and second p-channel metal oxide semiconductor (PMOS) transistors connected in series between a power supply voltage and the second node,
wherein the first PMOS transistor includes a source coupled to the power supply voltage, a gate receiving the precharge signal and a drain coupled to the second PMOS transistor,
wherein the second PMOS transistor includes a source coupled to the first PMOS transistor, a gate receiving the second control voltage and a drain coupled to the second node, and
wherein the second PMOS transistor is configured to provide the control current to the second node in response to the second control voltage.

17. The nonvolatile memory device of claim 15, further comprising:
a voltage generator including a boost voltage generator configured to apply a boost voltage higher than a power supply voltage to a gate of the first selection transistor and a selected word-line from among the plurality of word-lines.

18. The nonvolatile memory device of claim 15, further comprising:
a voltage generator including:
a first boost voltage generator configured to apply a first boost voltage higher than a power supply voltage to a gate of the first selection transistor in response to the operating temperature being higher than a reference range; and
a second boost voltage generator configured to apply a second boost voltage higher than the power supply voltage to a selected word-line from among the plurality of word-lines in response to the operating temperature being lower than the reference range.

19. The nonvolatile memory device of claim 18, wherein the control circuit is configured to:
sense the operating temperature;
enable the first boost voltage generator in response to the sensed operating temperature being higher than the reference range; and
enable the second boost voltage generator in response to the sensed operating temperature being lower than the reference range.

20. A method of operating a nonvolatile memory device, wherein the nonvolatile memory device includes a memory cell array including a plurality of memory cells coupled to a plurality of word-lines and a plurality of bit-lines, a column selection circuit including a plurality of selection transistors coupled to the bit-lines, respectively, and a sensing circuit connected to the column selection circuit, the method comprising:
providing, by the sensing circuit, a precharge current to a sensing node;
adjusting the precharge current provided to a selected bit-line among the bit-lines according to an operating temperature of the nonvolatile memory device by applying a first control voltage to a gate of an adjusting transistor that connects the sensing node to a first group of selection transistors among the selection transistors, a level of the first control voltage increasing in proportional to the operating temperature;
applying a boost voltage greater than a power supply voltage to a first selection transistor and a first word-line, wherein the first selection transistor of the first group of selection transistors is coupled to the selected bit-line and the first word-line is coupled to a selected memory cell; and
sensing a voltage of the sensing node to output data.

* * * * *